United States Patent [19]
Shamouilian et al.

[11] Patent Number: 6,095,084
[45] Date of Patent: Aug. 1, 2000

[54] HIGH DENSITY PLASMA PROCESS CHAMBER

[75] Inventors: Shamouil Shamouilian, San Jose; Ananda H. Kumar, Milpitas; Arnold Kholodenko, San Francisco, all of Calif.; Dennis S. Grimard, Ann Harbor, Mich.; Jonathan D. Mohn, Saratoga, Calif.; Michael G. Chafin; Kenneth S. Collins, both of San Jose, Calif.

[73] Assignee: Applied Materials, Inc., Santa Clara, Calif.

[21] Appl. No.: 08/893,599

[22] Filed: Jul. 14, 1997

Related U.S. Application Data

[63] Continuation-in-part of application No. 08/832,743, Apr. 4, 1997, which is a continuation-in-part of application No. 08/743,059, Nov. 4, 1996, and a continuation-in-part of application No. 08/597,577, Feb. 2, 1996, and a continuation-in-part of application No. 08/648,254, May 13, 1996.

[51] Int. Cl.$^7$ .................................................. C23C 16/00
[52] U.S. Cl. ................................. 118/723 E; 156/662.1; 156/643.1; 156/345; 438/656; 361/234
[58] Field of Search ........................... 156/345, 662.1, 156/643.1; 361/234; 204/298.37; 118/723 E; 489/678; 315/111.41; 438/656

[56] References Cited

U.S. PATENT DOCUMENTS

| | | | |
|---|---|---|---|
| 3,617,459 | 11/1971 | Logan | 204/192 |
| 4,368,092 | 1/1983 | Steinberg et al. | 489/678 |
| 5,215,619 | 6/1993 | Cheng et al. | 156/345 |
| 5,221,450 | 6/1993 | Hattori et al. | 204/192.32 |
| 5,225,024 | 7/1993 | Hanley et al. | 156/345 |
| 5,241,245 | 8/1993 | Barnes et al. | 315/111.41 |
| 5,280,156 | 1/1994 | Niori et al. | 219/385 |
| 5,401,350 | 3/1995 | Patrick et al. | 156/345 |
| 5,413,360 | 5/1995 | Atari et al. | 279/128 |
| 5,423,945 | 6/1995 | Marks et al. | 156/662.1 |
| 5,449,977 | 9/1995 | Nakagawa et al. | 315/111.51 |
| 5,463,526 | 10/1995 | Mundt | 361/234 |
| 5,571,366 | 11/1996 | Ishii et al. | 156/345 |
| 5,597,438 | 1/1997 | Grewal et al. | 156/345 |
| 5,629,653 | 5/1997 | Stimson | 333/17.3 |
| 5,631,803 | 5/1997 | Cameron et al. | 361/234 |
| 5,647,913 | 7/1997 | Blalock | 118/723 I |
| 5,684,669 | 11/1997 | Collins et al. | 361/234 |
| 5,707,486 | 1/1998 | Collins | 156/643.1 |
| 5,726,097 | 3/1998 | Yanagida | 438/622 |
| 5,754,391 | 5/1998 | Bates | 361/234 |
| 5,795,452 | 11/1998 | Kinoshita et al. | 204/298.37 |
| 5,800,618 | 9/1998 | Niori et al. | 118/723 E |
| 5,834,371 | 11/1998 | Ameen et al. | 438/656 |

FOREIGN PATENT DOCUMENTS

| | | | |
|---|---|---|---|
| 07150360 | 6/1995 | Japan | C23C 16/50 |
| 9514308 | 5/1995 | WIPO . | |

OTHER PUBLICATIONS

U.S. Patent Application entitled, Inductively Coupled RF Plasma Reactor Having an Overhead Solenoidal Antenna; filed May 13, 1996; Serial No. 08/648,254; Inventors: Collins, et al.; Attorney Docket No. 1115.

U.S. Patent Application entitled, "Improving Plasma Process Performance by Filtering Plasma Sheath–generated Harmonics"; filed Apr. 4, 1997; Serial No. 08/832,743; Inventors: Roderick, et al.; Attorney Docket No. 1424.P1.

U.S. Patent Application entitled, "Parallel–plate Electrode Plasma Reactor Having an Inductive Antenna and Adjustable Radial Distribution of Plasma Ion Density"; filed Oct. 24, 1996; Serial No. 08/740,124; Inventors: Collins, et al.; Attorney Docket No. 400.P4.

*Primary Examiner*—Thi Dang
*Assistant Examiner*—Rudy Zervigon
*Attorney, Agent, or Firm*—Janah and Associates

[57] ABSTRACT

A process chamber 55 for processing a semiconductor substrate 60 in a plasma, comprises a process gas distributor 100 for distributing process gas into a plasma zone 65 in the chamber. An inductor antenna 135 is used to form an inductive plasma from the process gas in the plasma zone. A primary bias electrode 145 on a ceiling 140 of the chamber 55 has a conducting surface 150 exposed to the plasma zone 65. A dielectric member 155 comprising a power electrode 165 embedded therein, has a receiving surface for receiving a substrate 60. A secondary bias electrode 170 below the dielectric member 155 has a conducting surface 175 exposed to the plasma zone 65. An electrode voltage supply 180 maintains the power electrode 165, primary bias electrode 145, and secondary bias electrode 170, at different electrical potentials to provide a high density, highly directional, plasma in the plasma zone 65 of the chamber 55.

86 Claims, 15 Drawing Sheets

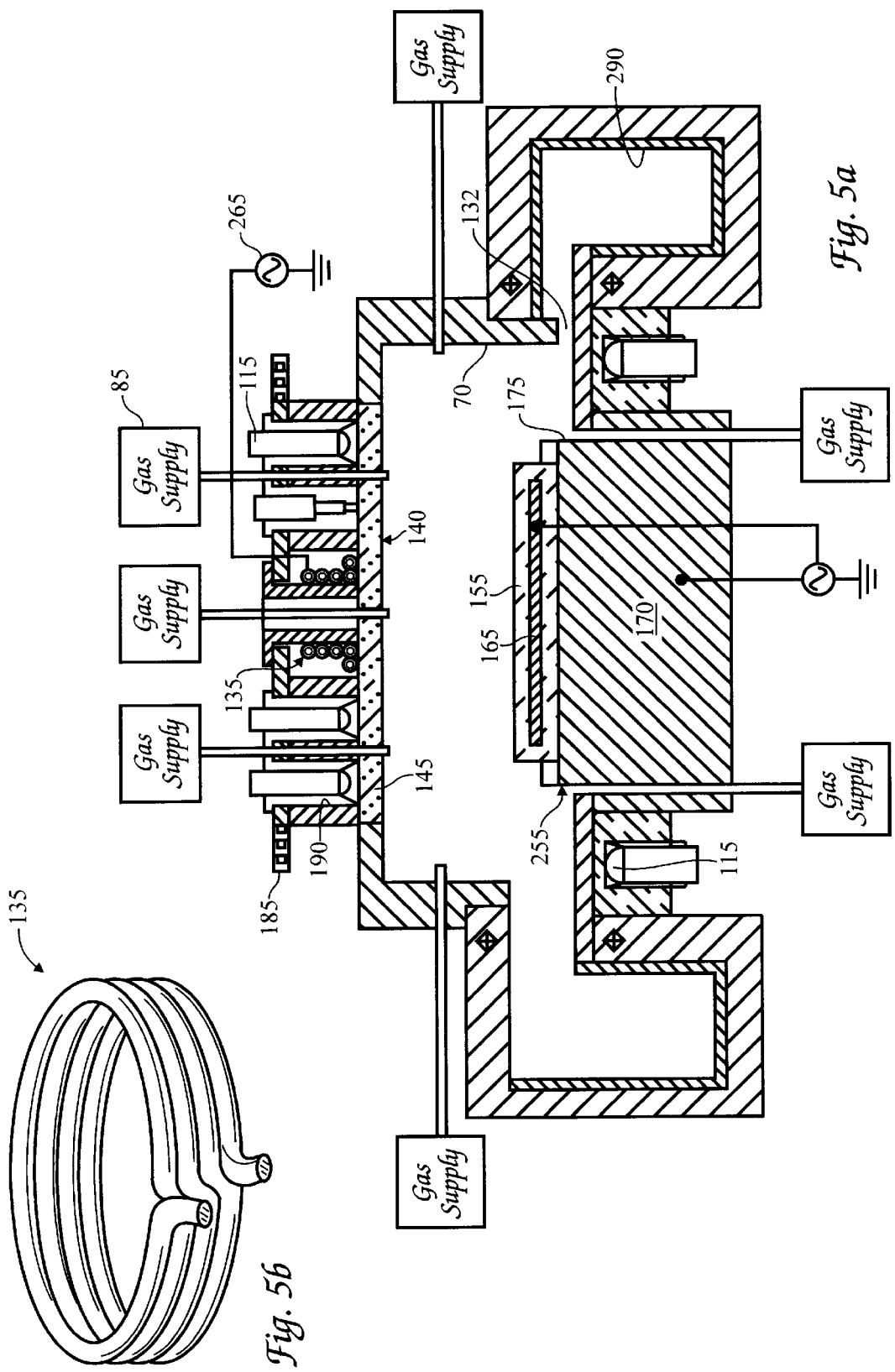

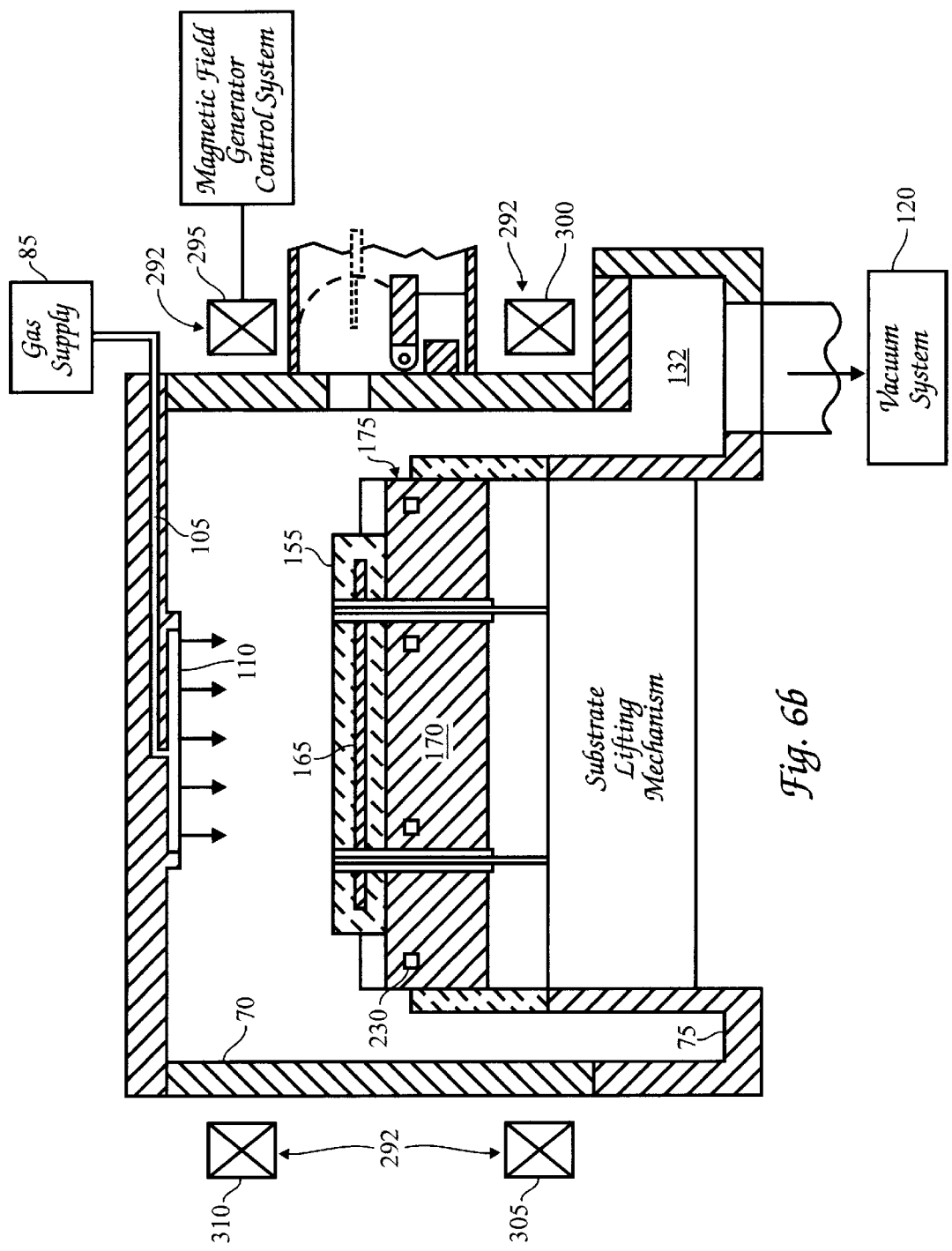

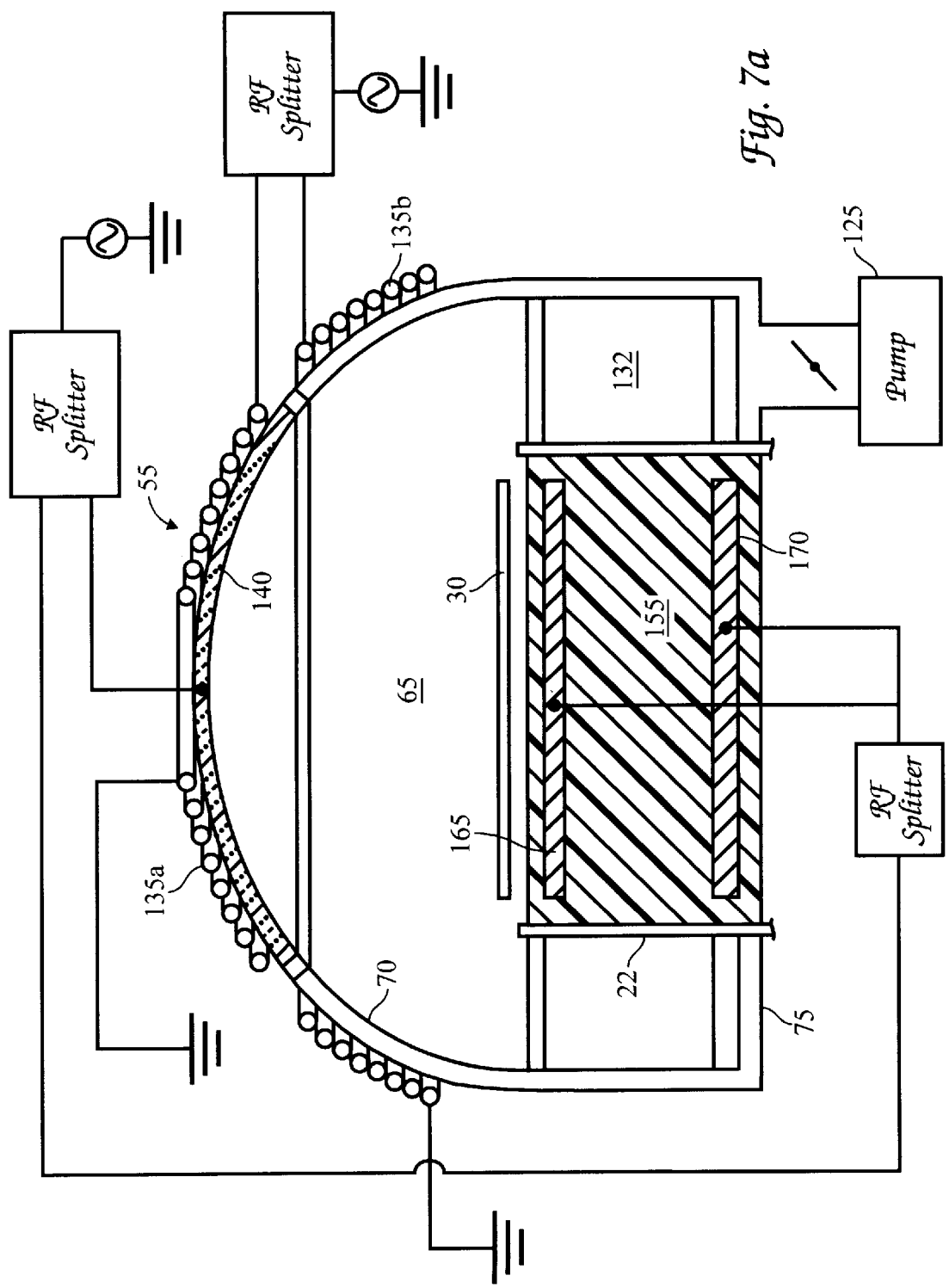

HIGH DENSITY PLASMA PROCESS CHAMBER

CROSS-REFERENCE

This is application is a continuation-in-part of the following co-pending applications, all of which are incorporated herein by reference:

U.S. patent application Ser. No. 08/832,743 filed on Apr. 8, 1997 by Craig Roderick et al., entitled "Improving Plasma Process Performance by Filtering Plasma Sheath-Generated Harmonics," which is a continuation-in-part of U.S. application Ser. No. 08/743,059 filed on Nov. 4, 1996 by Craig Roderick et al., entitled "RF Tuning Method for an RF Plasma Reactor Using Frequency Serving and Power, Voltage, Current or dI/dt Control";

U.S. patent application Ser. No. 08/597,577 filed Feb. 2, 1996 by Kenneth S. Collins et al., entitled "Parallel Plate Electrode Plasma Reactor Having an Inductive Antenna Coupling Power through a Parallel Plate Electrode"; and U.S. patent application Ser. No. 08/648,254 filed May 13, 1996 by Kenneth S. Collins et al., entitled "Inductively Coupled RF Plasma Reactor Having an Overhead Solenoidal Antenna."

BACKGROUND

The present invention relates to a plasma process chamber for processing semiconductor substrates.

A plasma process chamber is used in semiconductor fabrication processes, for plasma enhanced chemical vapor deposition (CVD), reactive ion-etching (RIE), and ion implantation. FIG. 1 shows a conventional process chamber 20 having a gas distributor 22 that provides process gas to the chamber. A coil power supply 24 powers an inductor coil 26 adjacent to the chamber that inductively couples RF energy to the process gas to form a plasma. Process electrodes that are used to couple RF power to the plasma typically include a cathode 28 below the substrate and an anode 32 surrounding the cathode. The cathode 28 is electrically insulated from the anode 32 by one or more quartz or silicon dioxide insulator shields 34 that extend below and around the cathode. The power supply 36 applies an impedance matching RF bias power to the cathode and the anode is formed by electrically grounded sidewalls and top walls in the chamber 20. The cathode 28 is capacitively coupled to the anode 32 via the electrostatic chuck 38 that rests on the cathode, the substrate 30, and the plasma sheath that forms at the boundary of the cathode. The capacitively coupled electric field energizes and accelerates the plasma ions toward the substrate 30.

Conventional chambers 20 often have low plasma ion densities and plasma ion energy distributions which are spread out over a wide range of energy levels with multiple energy level peaks. The plasma ion density and energy levels depend upon the electron density or energy distribution in the plasma sheath, the power and frequency of the capacitively-coupled RF power applied to the electrodes 28, 32, the process gas composition and pressure, and the components inside the chamber. The plasma sheath is an electron deficient region that arises due to the difference in mobility between electrons and positive ions in the plasma, and has an associated voltage waveform that is effected by the resonance, impedance load, and other electrical characteristics of the chamber. This voltage waveform is perturbed from normal by the harmonic content of the plasma sheath. The RF bias and impedance matching circuit, power transmission lines, structure of the electrodes 28, 32, and the components inside the chamber 20, all effect the development of harmonics at the plasma sheath, which in turn disturb the sheath voltage waveform over time giving rise to perturbed waveforms. The perturbed waveform can give rise to a "dual predominant" multimodal plasma energy distributions in which the plasma ion energy distribution curve has two or more peaks. Such multi-peak energy distributions are undesirable because a large spread of plasma ion energies provides lower average plasma ion energy levels that result in poor plasma performance, for example, etch stopping in processes for etching high aspect ratio trenches.

Low plasma density can also result from the large number of components that are in the chamber 20, such as the dielectric or insulator shields 34, electrostatic chuck 38, focus rings and gas seals. These components provide a large chamber impedance load due to the number of capacitive couples 40 formed across the components. For example, capacitive couples 40 extending from the sidewalls of the cathode 28, through the adjacent dielectric components, and to the surrounding anode walls 32, form individual "leaky" capacitors that add impedance loads to the chamber. As a result of these parasitic or stray capacitances, it is difficult to tune the RF bias power source to match the plasma impedance, because the impedance load of the stray capacitances is typically much larger than the impedance load of the plasma. Also, the stray capacitances can cause the plasma sheath waveform to change as a function of the magnitude of the capacitive effects. Thus it is desirable to have a chamber that minimizes stray capacitance and impedance loads between the cathode, dielectric structures, and other components in the chamber, to provide more stable and controllable plasma characteristics.

Components which capacitive couple with one another in the chamber can also significantly weaken the electric field in the chamber resulting in low vector directional energies of the plasma ions. The low directional energy of the plasma ions at least partially results from capacitive coupled surfaces which are at angles other than the perpendicular direction to the plane of the substrate. In particular, coupling at the vertical peripheral edges of the cathode 28 can cause electric field components that are perpendicular to the plane of the substrate 30 to deviate from normal and bend toward the peripheral edge of the cathode 28. Also, the electrostatic chuck 38 that is used to securely hold the substrate in the chamber provides additional interfaces that capacitive couple to one another. Plasma species are also attracted toward the capacitive couples formed across the insulator shield 34 surrounding the substrate 30. These capacitive couples result in asymmetric distributions of plasma ion energy levels or plasma ion densities across the substrate surface causing the peripheral edge and center of the substrate to be processed at different rates.

Another problem with conventional chambers arises from use of the quartz insulator shields 34 surrounding the cathode 28. The insulator shields 34 reduce the ratio of the surface area of the cathode 28 to the surface area of the anode 32, by occupying space in the chamber, and preventing the cathode from extending across the entire width of the chamber. A low cathode to anode surface area ratio reduces the plasma ion density and energy in the chamber. Also, the smaller diameter of the cathode can reduce plasma ion density or energy levels at the peripheral edge of the substrate 30 as compared to the center of the substrate. Moreover, the quartz insulator shield 34 has a complex shape, is expensive to fabricate, and often requires replacement due to erosion in the corrosive plasma environments.

The insulator shield 34 also acts as a thermal insulator surrounding the cathode 28 which reduces the flow of heat to and from the substrate. Thus, it is desirable to have a plasma process chamber that is absent insulator shields 34 around the cathode 28, and that allows the cathode 28 to be extended across substantially the entire width of the chamber. However, this is not possible in present chamber designs, because the cathode 28 typically comprises a metal base plate that is exposed to the plasma and would electrically short in the plasma, without the presence of the insulator shield 34 around the cathode.

Conventional chambers also have problems that arise from the arrangement of the inductor coils 26 adjacent to the chamber 20. Inductor coils 26 that are parallel to the sidewalls of the chamber 20 provide non-uniform fields across the substrate surface with strong inductive electric fields at the center of the substrate 30 and weak inductive fields at the peripheral edge of the substrate 30. On the other hand, inductor coils that inductively couple energy through flat dielectric ceilings which allow RF inductive electric fields to permeate therethrough (not shown), do not allow capacitive coupling of energy through the ceiling because it is made of non-conducting dielectric material. It is desirable for both the capacitive and inductive electric field components in the chamber to have highly directional vector field components that are substantially perpendicular to the surface of the substrate, and which extend uniformly across the entire substrate surface.

Another problem with conventional designs for inductor coils 26 arises from the relatively large volume of space that is required in a chamber 20 to form an inductively coupled plasma from conventional inductor coils. The inductor coil 26 typically encircles the chamber 20, and the chamber has to have a sufficiently large volume to provide a large skin depth for the RF induction field from the coil. Without the large skin depth, the magnitude of the RF induction field formed in the chamber 20 would not be sufficiently high to generate a plasma. However, a plasma chamber 20 having a large internal volume is undesirable because relatively large power levels of RF bias voltages must be used to energize the plasma ions, causing excessive heating of the substrate. Also, it is more difficult to stabilize or maintain uniform plasma ion densities and energy distributions across large plasma volumes. It is also more difficult to finely tune a high density plasma that occupies a large volume of space because of the increased energy perturbations that occur in the larger plasma volume. Novel induction coil designs are needed to provide high density plasmas in smaller volume chambers that have diameters slightly larger than the diameter of the substrate 30.

Thus there is a need for a plasma process chamber that provides a high density plasma with a uniform energy distribution and reduced perturbations of ion energy distribution. There is also a need for an apparatus that provides a uniform distribution of plasma ions having high directional energy vectors, across the entire surface of the substrate. There is also a need for process electrode and inductor coil designs that can generate a stabilized and controllable plasma in the chamber. There is a further need for a plasma processing chamber that eliminates use of insulator shields around the cathode and that provides a high anode to cathode surface area ratio in the chamber.

SUMMARY

The present invention relates to a process chamber that provides a high density, highly directional plasma for processing a semiconductor substrate. The process chamber comprises a process gas distributor for distributing into a plasma zone in the chamber, a process gas capable of forming a plasma. A primary bias electrode on a ceiling of the chamber has an electrically conducting surface exposed to the plasma zone. A unitary monolithic dielectric member is positioned below the primary bias electrode. The dielectric member comprises a power electrode embedded therein and has a receiving surface for receiving a substrate. A secondary bias electrode is below the dielectric member. An electrode voltage supply maintains the power electrode, primary bias electrode, and secondary bias electrode, at different electrical potentials to provide a high density, highly directional plasma in the chamber.

In a preferred embodiment, the unitary monolithic dielectric member containing the power electrode comprises a coupling cover layer having a receiving surface for receiving a substrate in facing relationship to the primary bias electrode. The coupling layer comprises an electric field absorption sufficiently low for electric fields from RF and DC voltages applied to the electrode to capacitively couple therethrough to energize plasma in the chamber and to electrostatically hold the substrate, respectively. A non-coupling layer surrounds the other surfaces of the power electrode, the non-coupling layer comprising an electric field absorption sufficiently high to substantially preclude capacitive coupling of the RF voltage from the power electrode to the surrounding chamber walls. The unitary monolithic dielectric member removes the need for a separate insulator shield around the power electrode, thereby providing a much low chamber impedance load of less than 3000 picofarads. This substantially improves chamber plasma performance by reducing the chamber impedance load that is added to the plasma impedance load.

Preferably, an inductor antenna is used to generate an induction field in the chamber to form an inductive plasma from process gas in the plasma zone. The inductor antenna is, more preferably, adjacent to a semiconductor ceiling having (i) an electrical susceptibility sufficiently low to allow an RF induction field to permeate therethrough, and (ii) a conducting surface exposed to the plasma zone. A method of using the process chamber to process a substrate, comprises the steps of: (1) placing a substrate on the surface of the unitary dielectric member; (2) passing a current through the inductor antenna to generate an inductive field in the chamber; and (3) maintaining the power electrode, and the primary and secondary bias electrodes, at different electrical potentials to form a high density, highly directional plasma in the chamber.

Instead of a single unitary dielectric member with an electrode embedded therein, the process chamber can also comprise a plurality of dielectric members positioned below the semiconductor ceiling, each one of the dielectric members comprising an electrode embedded therein. The first dielectric member comprises a receiving surface for receiving a substrate thereon. An electrode voltage supply is used to maintain the semiconductor ceiling and the electrodes at different electrical potentials to energize the plasma in the chamber.

In another version of the process chamber, the primary bias electrode is made of a semiconductor material that forms a wall on a ceiling of the chamber. The semiconductor wall has an electrically conducting surface and an electrical susceptibility sufficiently low to allow an RF induction field to permeate therethrough. One or more inductor antennas are positioned adjacent to the semiconductor wall to generate an RF induction field that is transmitted through the semiconductor ceiling to form a plasma in the chamber. A unitary monolithic dielectric member comprising a power electrode embedded therein is in the chamber. The dielectric member comprises (i) a coupling layer that has a receiving surface for receiving a substrate and an electric field absorption sufficiently low for RF and DC voltages applied to the power electrode to capacitive couple to energize the plasma in the chamber and to electrostatically hold the substrate, respectively, and (ii) an non-coupling layer surrounding the other surfaces of the electrode, the non-coupling layer comprising an electric field absorption sufficiently high to reduce capacitive coupling therethrough. An electrode voltage supply is used to maintain the primary bias electrode and power electrode at different electrical potentials relative to one another thereby providing a high density, highly directional, plasma in the chamber.

In yet another version, the process chamber comprises a gas distribution system for distributing process gas into the chamber. A primary bias electrode is on a ceiling of the chamber, the primary bias electrode having a conducting surface exposed to the plasma zone. A unitary monolithic dielectric member comprising a power electrode embedded therein, has (i) a coupling layer having a receiving surface for receiving a substrate, and an electric field absorption sufficiently low for RF and DC voltages applied to the electrode to capacitive couple therethrough to energize the plasma in the chamber and to electrostatically hold the substrate, respectively, and (ii) an non-coupling layer surrounding the other surfaces of the electrode, the non-coupling layer comprising an electric field absorption sufficiently high to reduce capacitive coupling therethrough. A electrode voltage supply is used to maintain the primary bias electrode and power electrode at different electrical potentials relative to one another. A multi-directional magnetic field generator adjacent to the chamber generates in the plasma zone, a multi-directional magnetic field having angular orientations and magnitudes that vary over time. The magnetic field generator can comprise a plurality of electromagnets positioned adjacent to the chamber and an electromagnet power source that varies the current applied to the electromagnets. Alternatively, the magnetic field generator comprises a plurality of movable permanent magnets positioned adjacent to the chamber, and means for moving the permanent magnets.

DRAWINGS

These and other features, aspects, and advantages of the present invention will become better understood with regard to the following description, appended claims, and accompanying drawings which illustrate examples of preferred embodiments of the invention, where:

FIG. 5a is a schematic partial sectional view of alternative embodiment of the process chamber showing a preferred coil configuration;

FIG. 5b is a perspective view of an inductor antenna coil used in the process chamber of FIG. 5a;

FIG. 6b is schematic partial sectional view of the process chamber of FIG. 6a showing positioning of the multi-directional magnetic field generator;

FIGS. 7a and 7b illustrate alternative embodiments of the process chamber in which the ceiling comprises a dome shaped wall of dielectric material with the inductor coil adjacent to the ceiling;

DESCRIPTION

Figure 1:
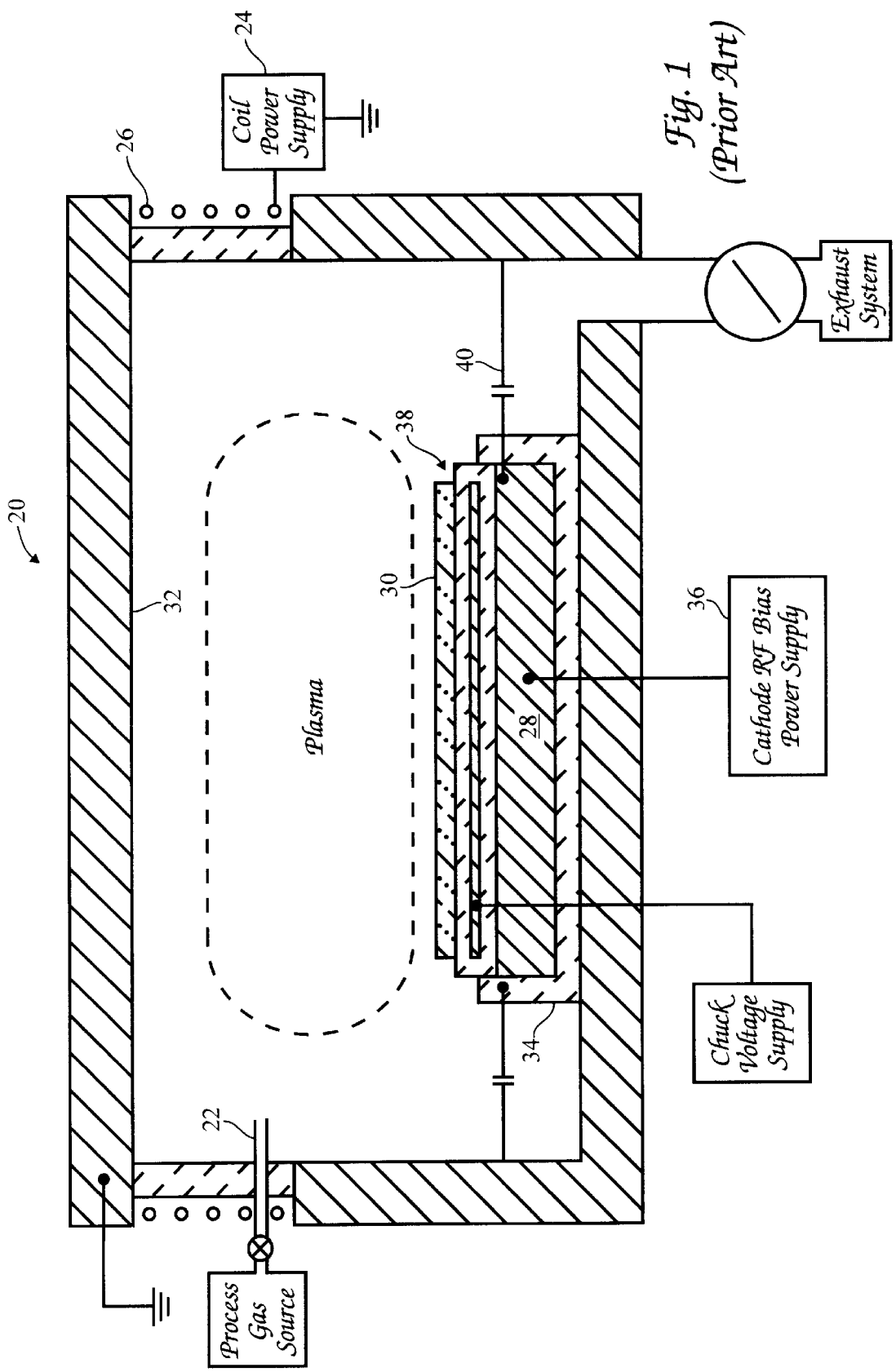
FIG. 1 (prior art) is a partial sectional schematic view of a prior art process chamber showing insulator shields around the cathode and capacitance couples formed in the chamber.

The present invention is directed to a plasma processing apparatus 50 used to process substrates 30 in a high density, highly directional, plasma formed in a process chamber 55. A high density plasma is a plasma having an ion energy density in excess of $10^{11}$ ions/cm$^3$ in contrast to conventional plasmas that have lower ion densities on the order of $10^{10}$ ions/cm$^3$. By highly directional it is meant that the charged plasma ions and species are energized by electric field vector components 60 within the plasma zone 65 to accelerate in the direction substantially perpendicular to the plane of the substrate 30. The high density and highly directional plasma provides a large number of reactive plasma species that energetically impinge on the substrate 30 to efficiently chemically react with or transfer energy to the substrate. The highly directional plasma can be used to etch, implant, or deposit material on a substrate 30.

Figure 2:
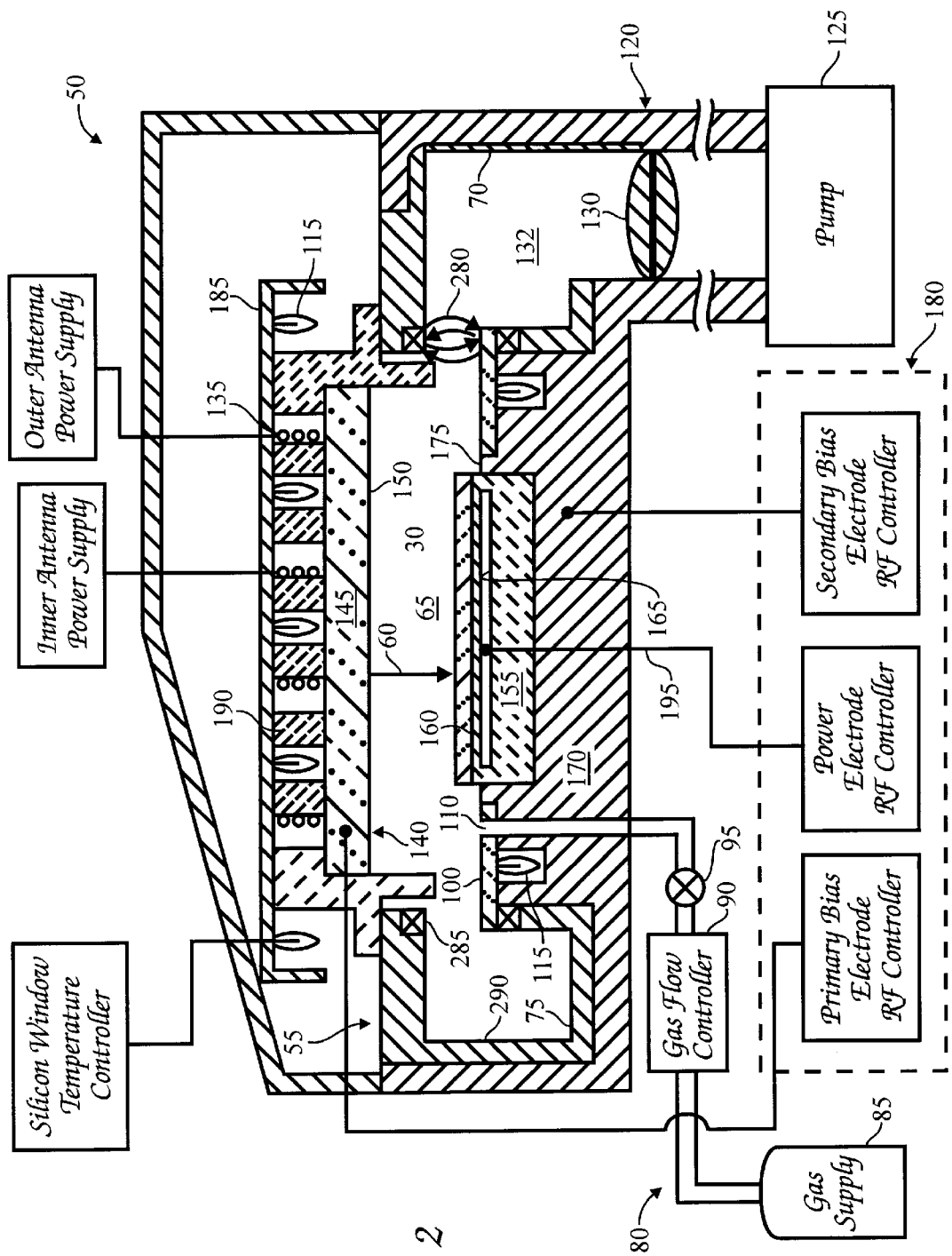
FIG. 2 is a sectional schematic view of a process chamber according to the present invention illustrating an exemplary arrangement of inductor coils, primary bias electrode, power electrode, and secondary bias electrode.
Figure 3A:
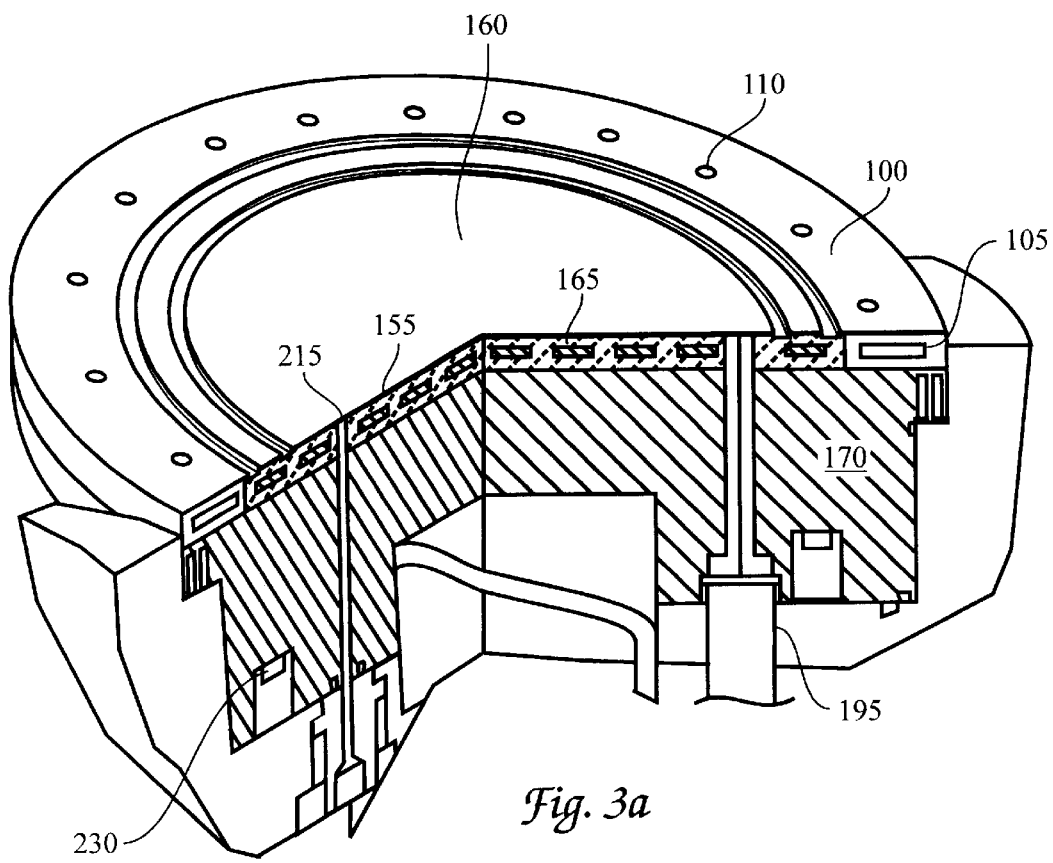
FIG. 3a is a partial sectional perspective view of the lower portion of the process chamber showing the unitary monolithic dielectric member with the power electrode embedded therein, and an underlying secondary bias electrode with cooling channels.

An exemplary plasma processing apparatus 50 of the present invention, is schematically illustrated in FIG. 2, and is provided only to illustrate an example of the present invention and should not be used to limit the scope of the invention. The apparatus 50 generally comprises an enclosed chamber 55 having sidewalls 70 and a bottom wall 75 fabricated from any one of a variety of materials including metals, ceramics, glasses, polymers and composite materials. Metals commonly used to fabricate the process chamber 55 include aluminum, anodized aluminum, "HAYNES 242," "A1-6061," "SS 304," "SS 316," and INCONEL, of which anodized aluminum is preferred. Process gas is introduced into the chamber 55 through a gas distribution system 80 that distributes the gas in the chamber, and includes a process gas supply 85 and a gas flow control system 90 that operates gas flow meters 95. Preferably, the gas distributor comprises a silicon ring 100, that surrounds the substrate 30. As shown in FIG. 3a, the silicon ring 100 comprises a circular passageway 105 for holding process gas and an array of gas injection holes 110 to distribute the process gas around the periphery of the substrate 30. Preferably, the silicon ring 100 is temperature controlled to an accuracy of ±5° C. in a temperature range of about 250 to about 600° C., using an optical pyrometer for temperature feedback, an array of lamps 115 below the ring for radiant heating of the ring, and cooling by conduction to the bottom wall 75. The temperature controlled silicon ring 100 also provides a controlled source of silicon for scavenging free fluorine ions and radicals from the process environment. An exhaust system 120, comprising one or more exhaust pumps 125 (typically including a 1000 liter/sec roughing pump) and throttle valves 130 is used to exhaust spent process gas and control the pressure of process gas in the chamber 55. Preferably, an asymmetric pumping channel 132 is used to pump gases out of the chamber 55 to provide a uniform distribution of gaseous species around the surface of the substrate 30.

In the embodiment shown in FIG. 2, the chamber 55 comprises an inductor antenna 135 adjacent to the chamber that generates an induction coupled field in the chamber to form a high density inductive plasma therein. The inductor antenna 135 preferably comprises multiple coils positioned adjacent to the chamber ceiling 140 for inductively coupling RF power into the chamber 55. A plurality of process electrodes are electrically biased relatively to one another and capacitively couple through the plasma sheath and dielectric layers separating the electrodes to energize the plasma ions. A primary bias electrode 145 comprises a first conducting surface 150 exposed to the plasma zone 65. A unitary monolithic dielectric member 155 positioned directly below the primary bias electrode 145 has a receiving surface 160 for receiving a substrate 30 thereon. A power electrode 165 is embedded in the dielectric member 155 so that dielectric material completely surrounds the power electrode. The chamber 55 further comprises a secondary bias electrode 170 positioned directly below the dielectric member 155 and preferably having a second conducting surface 175 exposed to the plasma zone 65. An electrode voltage supply 180 is provided for maintaining the power electrode 165, and the primary and secondary bias electrodes 145, 170 at different electrical potentials relative to one another. The combination of three or more electrodes, which are vertically aligned to form a stacked cylindrical arrangement of electrodes, provides an energetic plasma having highly directional plasma ions within the chamber 55.

The primary bias electrode 145 comprises a conductor element positioned directly over the substrate 30, that has an area sized sufficiently large to encompass substantially the entire area of the substrate. The primary bias electrode 145 capacitively couples to the power electrode 165 in the dielectric member 155 to provide highly directional electric field components 60 that are substantially perpendicular to the plane of the substrate 30. In a preferred embodiment, the primary bias electrode 145 comprises a semiconductor ceiling 140 that serves as a conductor which can be biased or grounded to form an electric field in the chamber 55. The semiconductor ceiling 140 also serves as an induction field transmitting window that provides low impedance to an RF induction field transmitted by the inductor antenna 135 on the ceiling. The semiconductor ceiling 140 is sufficiently electrically conductive to serve as the primary bias electrode 145, and comprises an electric field susceptibility sufficiently low to transmit the induction field generated by the inductor antenna 135 through the ceiling with minimum loss of power. Preferably, the ceiling 140 comprises silicon that is less likely to be a source of contamination for processing silicon substrates 30, in comparison with other materials. However, other well-known semiconductor materials can also be employed, such as silicon carbide, germanium, or Group III–V compound semiconductors such as gallium arsenide and indium phosphide, or Group II–III–V compound semiconductors such as mercury-cadmium-telluride. In a preferred embodiment, the semiconductor ceiling 140 comprises a slab of semiconducting silicon having resistivity of less than about 500 $\Omega$-cm (at room temperature), more preferably about 10 $\Omega$-cm to about 300 $\Omega$-cm, and most preferably about 20 $\Omega$-cm to about 200 $\Omega$-cm.

The temperature of the silicon ceiling 140 is held in a range of temperatures at which the semiconductor material provides semiconducting properties and in which the carrier electron concentration is fairly constant with respect to temperature. For silicon, the preferred temperature range is from about 100 K (below which silicon begins to have dielectric properties) to about 600 K (above which silicon begins to have metallic conductor properties). At temperatures exceeding this range, silicon provides a conductance similar to that of a metal, and below this range of temperatures, behaves as a very low conductivity dielectric material. Active control of the temperature of the semiconductor ceiling 140 is preferred to allow it to function both as an induction field window and as an electrode. The active temperature control of the window also provides a consistent and stable plasma, and good "cold start" conditions for the plasma. The temperature of the ceiling 140 is controlled using a plurality of radiant heaters such as tungsten halogen lamps 115 and a thermal transfer plate 185 made of aluminum or copper, with passages (not shown) for a heat transfer fluid to flow therethrough. A heat transfer fluid source supplies heat transfer fluid to the passages to heat or cool the thermal transfer plate 185 as needed to maintain the chamber 55 at a constant temperature. The semiconducting ceiling 140 is in thermal contact with the plate 185 via a plurality of highly thermally conductive rings 190 whose bottom surface rests on the ceiling 140 and whose top surface supports the plate. Positioned around the lower portion of the heat transfer rings 190 is the inductor antenna 135. The height of the heat transfer rings 190 is selected so that the plate 185 is supported at a distance above the inductor antenna 135 of at least one half the overall height of the antenna. This mitigates or eliminates the reduction in inductive coupling between the antenna 135 and the plasma which would otherwise result from their close proximity to the conductive plane of the plate 185.

A power electrode 165 embedded in a unitary monolithic dielectric member 155 is spaced apart from, and directly below, the primary bias electrode 145. The power electrode 165 has a dual function, serving both as a plasma electrode to form a capacitively coupled electrical field extending from the power electrode to the primary bias electrode 145, and as an electrostatic member that generates an electrostatic charge for electrostatically holding the substrate 30 to the dielectric member 155. Preferably, the power electrode 165 is used to carry both a DC chucking voltage and the RF bias voltage, both of which are applied through an electrical connector 195 such as a banana jack inserted through the dielectric member 155 that connects to the power electrode 165. The voltage supply 180 includes an AC voltage supply for providing a plasma generating RF voltage to the power electrode 165, and a DC voltage supply for providing a chucking voltage to the electrode 165. The AC voltage supply provides an RF generating voltage having one or more frequencies from 13.56 MHZ to 400 KHz to form a capacitively coupled plasma in the chamber. The power level of the RF bias current applied to the electrode 165 is typically from about 50 to about 3000 Watts. A separate DC voltage is applied to the electrode 165 to form an electrostatic charge that holds the substrate to the chuck comprising a DC blocking capacitor circuit electrically connected to a DC chuck power supply. The RF power is coupled to a bridge circuit and a DC converter to provide DC chucking power to the electrode. The voltage supply 180 can also include a system controller for controlling the operation of the electrode by directing a DC current, and RF current, or both, to the electrode for chucking and dechucking the substrate 30 and for generating plasma in the process chamber 55. The DC chuck power supply typically provides a DC chucking voltage of 250 to 2000 volts to the electrode 165.

The active area of the power electrode 165 is selected to couple to the primary bias electrode 145 to maximize the area of the electric field therebetween. Because there is no insulator shield in the chamber, the active area of the power electrode can be increased to cover an area having a diameter that extends across the entire chamber bottom. This provides a much larger active power electrode area than the active area of conventional cathodes. Preferably, the ratio of the surface area of the primary bias electrode 145 to the surface area of the power electrode 165 is at least about 0.9:1. More preferably, the power electrode occupies an area of at least about 98% of the area of the primary bias electrode 145 in the chamber 55. For a circular substrate 30 having a diameter of about 200 mm (8-inch), a suitable diameter for the power electrode 165 is from about 180 to about 220 mm.

Plasma ion density in the plasma zone 65 is enhanced by positioning the power electrode 165 within a short distance from the primary bias electrode 145 which is no greater than the substrate diameter and as close as only a fraction of the substrate diameter (e.g, within a few centimeters for a 20 cm diameter wafer). The vertical confinement of the plasma near the substrate surface reduces energy losses due to parasitic capacitances from the power electrode 165 to the sidewalls 70 of the chamber 55 by bringing the power electrode much closer to the overhead primary bias electrode 145 than it is to the sidewalls of the chamber 55. Preferably the distance between the two electrodes is from about 1 to about 20 cm, and more preferably from about 2 to about 10 cm.

The unitary monolithic dielectric member 155 with the embedded power electrode 165 provides several advantages over prior art electrode designs. First, the combined plasma energizing and chucking electrode 165 is the sole conductor to which a "hot" RF potential is applied, with the other electrodes in the chamber 70 maintained at different potentials, including electrical ground or floating potentials, relative to the power electrode 165. Because the power electrode 165 is embedded in the unitary dielectric member 155, the power electrode does not need to be electrically isolated from electrical ground by an insulator shield as in the prior art chamber. The absence of any insulator shield reduces the number of parasitic capacitances between the power and secondary bias electrodes 165, 170, and the chamber walls 70, 75. This eliminates parasitic chamber impedance loads that would otherwise result between the power electrode 165, insulator shield, and grounded chamber walls. Because the parasitic RF losses to ground are minimized, the circuitry of the power supply 180 that matches the impedance of the RF load to that of the power supply is simplified, thereby providing more efficient transfer of electrical power to the plasma. Also, the complex shaped quartz insulator shield 34 is expensive to fabricate and can rapidly erode in many process environments. Finally, by combining the function of the electrode of an electrostatic chuck 38 and the power electrode 165, the use of a separate electrostatic chuck is no longer needed.

Figure 3B:
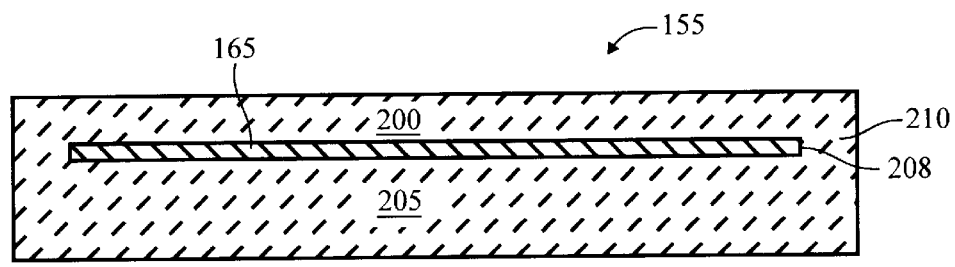
FIG. 3b is a schematic sectional view of the unitary monolithic dielectric member of FIG. 3a showing the electrode embedded therein.

Referring to FIGS. 3a and 3b, the electrical properties of the dielectric member 155 are selected to obtain a low electrical conductivity of about $10^8$ to about $10^{14}$ ohms-cm. The dielectric member 155 comprises a cover layer 200 that electrically insulates the electrode 165 to prevent shorting the plasma in the chamber 55 and to isolate the substrate 30 from the electrode. The dielectric cover layer 200 is formed from a dielectric material having an electric field absorption sufficiently low to permit an RF bias voltage applied to the electrode 165 to be capacitively coupled through the cover layer to the primary bias electrode 145 through the plasma sheath that forms over the dielectric member 155. The dielectric constant, electric field susceptibility, and thickness of the cover layer 200 are selected to provide enhanced capacitive coupling of an RF voltage applied to the power electrode 165 through the cover layer and to the primary bias electrode 145. In addition, the cover layer 200 allows the DC voltage applied to the power electrode 165 to electrostatically hold the substrate 30 by means of Coulombic or Johnsen-Raebek electrostatic attractive forces. Preferably, the cover layer 200 comprises a dielectric constant of at least about 2. The dielectric support layer 205 that is below the power electrode 165 is sufficiently thick and has an electric field absorption that is sufficiently high to reduce or limit electrically coupling between the power electrode and the underlying secondary bias electrode 170. Preferably, a perimeter edge 208 of the power electrode 165 that faces an electrically grounded sidewall 70 of the chamber 55, is enclosed by a side non-coupling layer 210 that comprises an electrical field absorption sufficiently high to preclude coupling of the electrode to the sidewall 70 in the chamber. Preferably, the dielectric material of the layers surrounding power electrode 165, such as the support layer 205 and the side layer 210, comprises a dielectric constant of at least about 1.

The RF reactance of different layers of the unitary dielectric member 155 is tailored to achieve the desired coupling or non-coupling effects through different portions of the dielectric member. Preferably, the dielectric cover layer 200 comprises an RF reactance of about 1 to about 500 Ohms, and more preferably 1 to 50 Ohms; and the support layer 205 comprises an RF reactance of about 100 to about 10000 Ohms, and more preferably 100 to 1000 Ohms. The minimum thickness of the dielectric layer above or below the power electrode 165 can be determined using the formula $C=(E_oE_rA)/L$; where L is the minimum thickness of the dielectric layer, A is the area, and $E_o$ and $E_r$ are the relative dielectric constants for the dielectric material and air. A suitable thickness of the dielectric cover layer 200 is about 1 to about 1000 microns and a suitable thickness of the dielectric support layer 205 is about 0.1 to about 15 mm. For a typical chamber design having an impedance load of about 8300 picofarad, the minimum thickness of the dielectric cover layer 200 is about 3.6 mm. For the present process chamber design having a lower impedance load of about 400 to 600 picofarad the minimum thickness of the dielectric support layer 205 is preferably about 8.4 mm. This value of capacitance gives a current load of about 6.4 Amps, which is about $\frac{1}{6}^{th}$ of the power level of the current delivered to the plasma of conventional chambers, to provide a more power efficient and tuned plasma.

The dielectric member 155 comprises a unitary and discrete structure containing the power electrode 165 embedded therein, that is fabricated as a monolithic structure from thermally fused ceramic or polymer. A monolith ceramic structure is preferred because such materials typically have low porosity, highly reliable electrical properties, and entirely enclose the power electrode 165 thereby eliminating the need for insulator shields in the chamber 55. The high dielectric breakdown strength of the dense ceramic structure also allows application of higher RF power levels to the power electrode 165 as compared to prior art dielectric members which typically have thin coatings of $Al_2O_3$ with relatively low dielectric breakdown strengths. Preferably, the dielectric member 155 is fabricated from a low porosity ceramic having a porosity of less than about 10%. Suitable ceramic materials include one or more of aluminum oxide, aluminum nitride, boron carbide, boron nitride, diamond, silicon oxide, silicon carbide, silicon nitride, titanium oxide, titanium carbide, yttrium oxide, and zirconium oxide. The thermal conductivity of the dielectric material is preferably a high conductivity of about 80 to about 240 Watts/m K, for example provided by diamond or aluminum nitride. The power electrode 165 embedded in the dielectric medium is fabricated from a conductive metal such as aluminum, copper, gold, molybdenum, tantalum, titanium, tungsten, and alloys thereof, and more preferably from a high melting point refractory metal, such as tungsten, tantalum or molybdenum, which allows thermal sintering of the dielectric member with the embedded electrode. The dielectric member 155 with the embedded power electrode 165 can be fabricated by isostatic pressing, hot pressing, mold casting, or tape casting, from a mixture of ceramic powders and a low concentration of organic binder material.

The unitary dielectric member 155 can also comprise gas feed through holes 215 that extend therethrough for providing helium heat transfer gas to the receiving surface 160 below the substrate 30. The helium gas feedthrough holes 215 have a diameter sufficiently small to prevent plasma glow discharge of the helium in the holes, which is preferably from about 1 to 10 mils (25 to 250 microns), otherwise the helium gas forms plasma glow discharges or electrical arcing at the termination end of the hole. Typically, a series of gas feed-thorough holes 215 are provided around the circumference of the dielectric member to provide a uniform distribution of heat transfer gas to the region below the substrate 30.

The secondary bias electrode 170 serves as a bias or reference electrode positioned below the power electrode 165. The secondary bias electrode 170 has a diameter or width that is substantially equivalent or larger that the diameter or width of the power electrode 165. When the secondary bias electrode 170 is maintained at a slightly negative or positive potential relative to the power electrode 165, the secondary bias electrode 170 serves as a secondary biasing means to control the bias voltage field between the primary bias electrode 145 and the power electrode 165. The secondary bias electrode 170 also serves to reduce stray capacitances that would otherwise occur between the chamber walls 70 and the power electrode 165, by maintaining a difference in electrical potential between the power electrode and the secondary electrode that redirects such capacitive coupling effects, via a controllable electric field strength, toward the secondary bias electrode. The electric field strength between the two electrodes is controlled by adjusting the relative potential difference of the voltages applied to the two electrodes.

Figure 4:
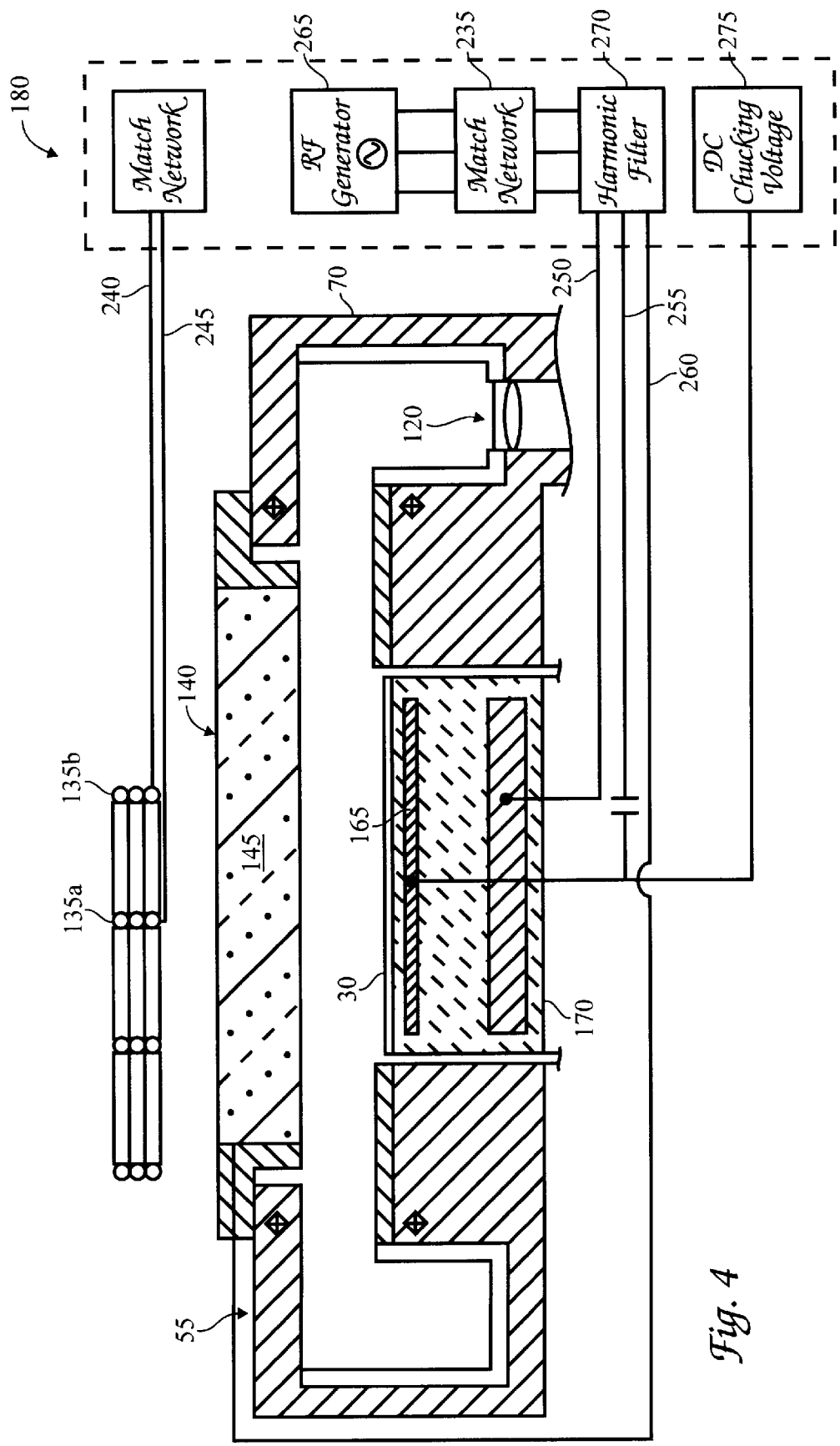
FIG. 4 is a schematic partial sectional view of the process chamber showing a block diagram of a power supply for powering the power electrode, primary and secondary bias electrodes, and inductor coil.

The secondary bias electrode 170 comprises a conductor element of an electrically conductive material, such as aluminum, that is positioned directly below the dielectric member 155 that contains the power electrode 165. A thermally conductive adhesive joins the dielectric member to the secondary bias electrode 170. Preferably, the adhesive comprises a pressure sensitive adhesive loaded with a thermally conductive inert powder on an aluminum carrier that has slits for the adhesive to flow through. The adhesive bonding is performed in an autoclave to obtain a uniform pressure and to avoid air pockets in the bond layer. The secondary bias electrode 170 can be embedded inside or covered by a dielectric material, as shown in FIG. 4. Alternatively, when the secondary bias electrode is maintained at a low voltage equivalent to that applied to the primary bias electrode or is electrically grounded, the secondary bias electrode 170 comprises electrically conducting surfaces 175 that are exposed to the plasma zone 65, for example, the sidewalls 225 of the conductor element, as shown in FIG. 5a.

In another function, as shown in FIG. 3a, the secondary bias electrode 170 comprises channels 230 for circulating heat transfer fluid therethrough to control the temperature of the dielectric member 155 and embedded power electrode 165 which can heat up due to bombardment by the energetic plasma ions. In this version, the electrode voltage supply 180 preferably maintains the secondary bias electrode 170 at a floating electrical potential, or grounded to avoid discharge of power to the heat transfer fluid, which is typically water, circulating within the channels 230. Because the dielectric member 155 is completely electrically isolated from the secondary bias electrode 170, no additional electrical insulation layer is required between the secondary bias electrode and the power electrode 215.

The electrode voltage supply 180 maintains the power electrode 165, the primary bias electrode 145, and the secondary bias electrode 170 at different electrical potentials relative to one another. The electrode voltage supply 180 can comprise one or more conventional voltage supply systems that have output terminals for conducting different voltages to the different electrodes, as illustrated by the block diagram shown in FIG. 4. Preferably, the electrode voltage supply 180 maintains the primary bias electrode 145 and the power electrode 165 at electrical potentials differing by at least about 1,000 volts to provide a strong capacitively coupled electric field between the two electrodes to energize the plasma in the chamber 55. The power supply 180 also maintains the power electrode 165 and the secondary bias electrode 170 at electrical potentials differing by at least about 100 volts to provide weak capacitive coupling between the two electrodes to reduce stray capacitances in the chamber 55. The parasitic capacitances in the chamber 55 are reduced by maintaining the secondary bias electrode 170 at a different potential from the overlying power electrode 165. For example, when the power electrode is "hot" with a high voltage applied thereto, the secondary bias electrode 170 can be electrical isolated, floating, or grounded. Use of a grounded bias electrode below the power electrode 165 provides a vector directionality to the electric field component that extends from the power electrode to the secondary bias electrode 170. Because the secondary bias electrode 170 is directly below the power electrode 165, any stray electric field component that would result from capacitive coupling between the power electrode and the chamber walls 70, 75 is redirected toward the secondary bias electrode. As a result, the electric field components 60 between the primary bias electrode 145 and the power electrode 165 are directed substantially vertically between the two opposing surfaces of the electrodes with little or field strength dilution or stray capacitive effects. In this manner, the power supply 180 maintains the primary and secondary bias electrodes 145, 170 at a first lower electrical potential and the power electrode 165 at a second higher electrical potential to provide a highly directional field in the chamber.

The vertically stacked cylindrical arrangement of the multi-electrode system provides strong, vertically oriented, electric field components 60 that are substantially parallel to the axis of the cylinder of the process chamber 55, and substantially perpendicular to the plane of the processing surface of the substrate 30. By controlling the magnitude of the electrical bias voltage applied to the primary, secondary, and power electrodes, the vector magnitude and direction of the energetic plasma species in the chamber 55 can also be more precisely controlled. This is achieved because the relative potential applied to each of the three electrodes 145, 165, 170 controls the magnitude and directionality of the electric field components 75 between the electrodes. For example, a high potential difference between the primary bias electrode 145 and the power electrodes 165 provides a highly energetic field between the two electrodes that accelerates the plasma species toward the substrate 30. Increasing the potential difference between the power electrode 165 and secondary bias electrode 165, however, would function to lower the strength of the electric field component directed toward the substrate 30 by redirecting some electric field components emanating from the power electrode in a downward direction toward the underlying secondary bias electrode. By controlling the relative potential of each of the electrodes, the energy and directionality of the plasma species can be fine tuned, to achieve the desired distribution of energy levels of the incident plasma ions and neutrals.

The plasma ion density and plasma ion energy can be independently controlled in the present process chamber 55 by separately controlling the source power level of the current applied to the inductor antenna 135, and the bias power levels of the voltages applied to each of the three stacked electrodes 145, 165, 170. Conventional chambers generally do not provide independent control of the ion energy levels through use of three or more plasma electrodes. Typically, the inductively-coupled power defines the bulk plasma characteristics or the plasma ion density, and the capacitively-coupled power defines the ion energy of the ions that are incident on the substrate 30. The duel source and bias controls of the process chamber 55 provides a high density plasma having ion energies in excess of $10^{11}$ ions/$cm^3$ in contrast to conventional RIE (reactive ion etching) reactors that provide much lower ion densities on the order of $10^{10}$ ions/$cm^3$; and allows more control over the bias voltages applied to the three electrodes. The superior ion to neutral species density ratio and energy level distribution also provides superior etching performance at small etch geometries, e.g. below 0.5 microns feature size, to provide better etch anisotropy, etch profile, and etch selectivity.

In addition, the uncertain parasitic capacitances between the power electrode 165 and the chamber walls 70,75 can be reduced or altogether eliminated by maintaining the potential difference between the power electrode 165 and secondary bias electrode 170 sufficiently high that ancillary electric field components extending out from the power electrode 165 are directed preferentially toward the secondary bias electrode 170. The effect of these stray capacitive loses on the impedance load of the chamber 55 can be significant. In fact, because the parasitic capacitance loads is much larger than even the capacitive load of the plasma itself, it is difficult to accurately match the impedance of the power supply 180 to the much smaller impedance load of the plasma. The ability to match the impedance of the plasma to that of the power supply 180 is also necessary to provide a more efficient and stable transfer of power to the plasma. Further, the magnitude of such parasitic capacitance losses depend on the type and location of hardware installed in the process chamber 55, for example, insulator shields, focus rings, and gas distribution nozzles. Because the process hardware can change from one process to another, the impedance load can also change resulting in difficulties in matching the impedance characteristics of each different chamber configuration. However, use of the power electrode 165 within the unitary dielectric member 155 provided chamber impedance loads of less than about 3000 picofarads, more typically less than about 1000 picofarads, and most typically less than 500 picofarads; whereas conventional chambers provide chamber impedance loads of 7000 to 10,000 picofarads. In this manner, the present invention reduced stray capacitances to provide a more efficient and controllable transfer of electrical power to the plasma and more consistent plasma load characteristics than conventional chambers.

Preferred features and aspects of the process chamber 55 of the present invention, and alternative chamber designs, will now be described.

Inductor Antenna and Silicon Ceiling

FIGS. 4 and 5a, illustrate versions of the present process chamber having an inductor antenna 135 and an RF field transparent ceiling. The inductor antenna 135 comprises inductor coils having a circular symmetry with a central axis coincident with the longitudinal axis of the process chamber 55 and perpendicular to the plane of the substrate 30. However, the circular symmetry of the inductor coil provides a spatial distribution of induction electrical field vector components that has a null or minimum along the central axis of symmetry which reduces the number of electrons produced over the center of the substrate 30. Thus, preferably, the inductor antenna 135 comprises non-planar solenoid coils which are stacked within each other and each have a central axis approximately coincident with the longitudinal axis of the chamber 55. The process chamber 55 is a cylindrical chamber and the coil windings of the inductor antenna 135 are vertically stacked in the form of two solenoids 135a, 135b to increase the product of current and antenna turns (d/dt)(N.I) near the ceiling 140 to provide a strong inductive flux linkage with close coupling to the plasma and therefore greater plasma ion density in the plasma zone 65 adjacent to the substrate 30, as described in afore-mentioned U.S. patent application Ser. No. 08/648,254.

FIG. 5b shows a preferred coil arrangement in which the windings of the antenna 135 are wound so that each individually turn is parallel to the horizontal plane of the substrate 30, except at a transition from one horizontal turn to the next, so that the windings of the antenna 135 are substantially parallel to the plane of the substrate. Preferably, the inductor antenna 135 comprises one or more solenoid coils, each coil having from 1 to 10 turns, and more typically from 2 to 6 turns. In a preferred arrangement, the inductor coils comprise two four-turn solenoid coils, the inner coil 135a having a diameter of approximately 9 cms and the outer coil 135b having a diameter of about 25 cms. Each of the coils is liquid cooled to reduce heat transfer to the semiconductor inductor window 145. The coils 135a, 135b are powered by a three channel RF generator that provides more precise RF power control with higher reliability and eliminates active RF matching of impedances. The control system uses frequency tuning in mutually exclusive frequency ranges for each source coil and bias power source in combination with true delivered power control.

Power Supply System

A preferred power supply system, shown in FIG. 4, comprises a combined RF/DC power supply 180 which powers both the inductor coils 135a, 135b and the process electrodes 145, 165, 170 using frequency tuning. The combined RF/DC power supply 180 has five RF channels and fixed impedance matching networks 235 for each channel to control the true delivered power. RF source power is supplied to the inner and outer inductor antennas by two independent outputs 240, 245 and RF bias power is supplied to the process electrodes 145, 165, 170 by independent electrode outputs 250, 255, 260. In a preferred embodiment, the electrodes 145, 165, 170 and each inductor antenna 135a, 135b operate at separate mutually-exclusive frequencies to provide more precise control of the RF power and to minimize RF interactions in the plasma. The combined RF/DC and coil power supply 180 includes separate, fixed impedance matching networks 235 for each RF power output. Eliminating active RF matching provides higher reliability and process repeatability. However, the present invention is not limited to the use of RF generators with fixed impedance match circuits, employing frequency tuning or related parameter servoing methods. In fact, the present invention is generally applicable where any kind of impedance match circuit is employed. For example, the impedance matching components may not be "fixed" but may be variable instead, in which a conventional impedance match controller in the RF generator operates by varying the reactance of one component in an impedance matching network (e.g., one of two capacitors in a π filter) to follow variations in the plasma chamber load impedance.

An RF voltage generator module 265 provides to the power electrode 165 an RF energy for generating an electric field that extends transversely through the substrate 30 to energize the plasma above the substrate. The RF frequency of the voltage applied to the power electrode 165 is mutually exclusive from the frequencies applied to the inductor antenna 135 and is applied through a fixed match network 235 with a harmonic isolation filter 270. Match network components are selected to approximately match the impedance of the RF voltage module 265 to the load impedance of the power electrode 165 in a selected frequency range. To tune the RF voltage module 265 to the chamber 55, the RF frequency is varied within a selected range of frequencies to find the minium reflected power. With a fixed network (source or bias) this results in a near-resonance condition, but not necessarily zero reflected power. The setpoint power is compared with the difference between the forward and the reflected power, and the forward power is automatically adjusted to provide constant delivered power at the setpoint level compensating for any mismatch in impedance magnitudes. Both control loops iterate to maintain a constant delivered power level.

The DC chucking voltage module 275 of the power supply 180 provides a DC output "chucking voltage" of from about 12 to about 36 volts DC to the power electrode 165 to generate an electrostatic charge in the electrode that can electrostatically hold the substrate 30 to the unitary monolithic dielectric member 155 via Coulombic or Johnsen-Raebek forces. For monopolar electrodes, the substrate 30 is charged by plasma ions in the chamber 55 to form residual charge having opposite polarity that attracts and holds the substrate to the dielectric member 155. For bipolar electrodes, two portions of the electrode electrically isolated from one another, are electrically biased relative to one another to generate an electrostatic force that holds the substrate 30 to the dielectric member 155.

Distortion of the sheath voltage waveform is prevented by providing a harmonic filter 270 between the chamber 55 and the RF outputs 250, 255, 260 of the combined RF/DC power supply 180 (or the impedance matching network 235) which offer a particular impedance to the harmonic components of the sheath voltage and current (e.g., the second and third harmonics), while cooperating with the impedance matching network at the fundamental frequency to provide the desired impedance match. The harmonic filter 270 are selected to adjust the phase and the amplitude of the harmonics generated in the plasma sheath to those harmonics required to produce a "normal" half-wave rectified sinusoidal sheath voltage waveform without significantly affecting the impedance match at the fundamental frequency provided by the impedance matching network 235. In one embodiment of the invention this is accomplished by selecting the harmonic filter 270 to provide an impedance to the desired harmonic (s) (e.g., second or second and third harmonics) much greater than that provided in the matching network 235.

In another embodiment, (not shown) a plurality of harmonic filters arranged in series can each provide a particular impedance magnitude and phase to a particular harmonic of the RF signal, for example, up to twenty harmonics, for precise optimization of performance. This embodiment may be particularly advantageous because changing design requirements increase the aspect ratio of the openings that will be etched in the substrate. Another advantage of using harmonic filters 270 is the ability to optimize the impedance matching circuit 235 to match a wider range of plasma load impedances at the fundamental frequency without regard to behavior at harmonic frequencies. This occurs because at the higher second and/or third harmonics, the impedance of the harmonic filter 270 is greater than that of the match circuit. Thus in the preferred embodiment in which the harmonic filter 270 is placed between the impedance match circuit and the chamber 55, the matching circuit is isolated from the plasma sheath-generated harmonic frequency components.

In a preferred embodiment of the invention, the harmonic filter 270 is principally inductive to provide the requisite phase response at the second harmonic (and of the third harmonic as well) to produce a normal or clean half-wave rectified sinusoidal sheath voltage waveform. Moreover, in accordance with the preferred embodiment, the magnitude of the impedance at the second and third harmonics is relatively high, typically above 50 Ω. While the preferred embodiment employs an inductive impedance at the second harmonic (and/or third harmonic), it is noted that in any case the impedance of RF outputs 250, 255, 260 have a large real component, while the chamber load impedance has a small real component and this nearly purely reactive, having a phase angle of either ±90 degrees. Thus, in either case the elements of the harmonic filter 270 will be either purely capacitive or inductive. The latter is preferred because generally the load impedance of the chamber/plasma/sheath is principally capacitive. Suitable circuits are described in aforementioned U.S. patent application Ser. No. 08/832,743 filed on Apr. 14, 1997 filed by Craig Roderick et al., entitled "Improving Plasma Process Performance By Filtering Plasma Sheath-Generated Harmonics."

In designing a system including the match circuit 235 and the harmonic filter 270, the match circuit component values are selected while taking the insertion impedance of the harmonic filter into account to provide an impedance match at the fundamental RF frequency. This match is sufficiently close to limit the reflected RF power to less than 20% and preferably less than 10% across an impedance range encompassing the anticipated variations in load impedance of the plasma or plasma chamber 55 during processing. The component values of the harmonic filter 270 are selected to provide a high inductive impedance across a range of second harmonic frequencies. This range is significant if the match circuit 235 employs RF tuning methods which vary the fundamental RF frequency to follow variations in the plasma chamber load impedance.

Magnetic Confinement and Stirring of Plasma Ions

Referring to FIG. 2, the plasma ion density and energy distribution can be further enhanced by generating a magnetic field 280 substantially perpendicular to the plane of the substrate 30 to confine the plasma to a plasma zone 65 immediately above the surface of the substrate 30. The magnetic field 280 is typically generated by permanent magnets 285 or electromagnetic antennas adjacent to the chamber 55 as for example described in U.S. Pat. No. 4,842,683, issued Jun. 27, 1989, which is incorporated herein by reference. Preferably, the permanent magnets 285 consist of dual circular rings sealed in removable chamber liners 290 inside the process chamber 55 that confine the plasma to the region between the semiconducting window 140, the silicon ring 100, and the substrate 30, defining a plasma zone 65 in the inner chamber. The magnets 285 have radially opposing magnetic field directions which produce a strong local magnetic fields 280 in the vicinity of the magnets which decay rapidly with radial distance from the magnets. Typically, the actual component of the magnetic field 280 is a maximum of 10 Gauss over the surface of the substrate 30. The magnetic confinement reduces the plasma ion current by typically at least two orders of magnitude and also serves to cutoff ion energies greater than 25 eV outside the inner chamber region. Magnetically confining the plasma to the processing surface of the substrate 30 increases the directionality of the plasma ions while minimizing contamination of the substrate 30. The magnetic confinement also allows chamber treatment steps required after etching to be reduced because of the smaller amount of polymeric deposits formed on chamber walls in the outer chamber region.

Figure 6A:
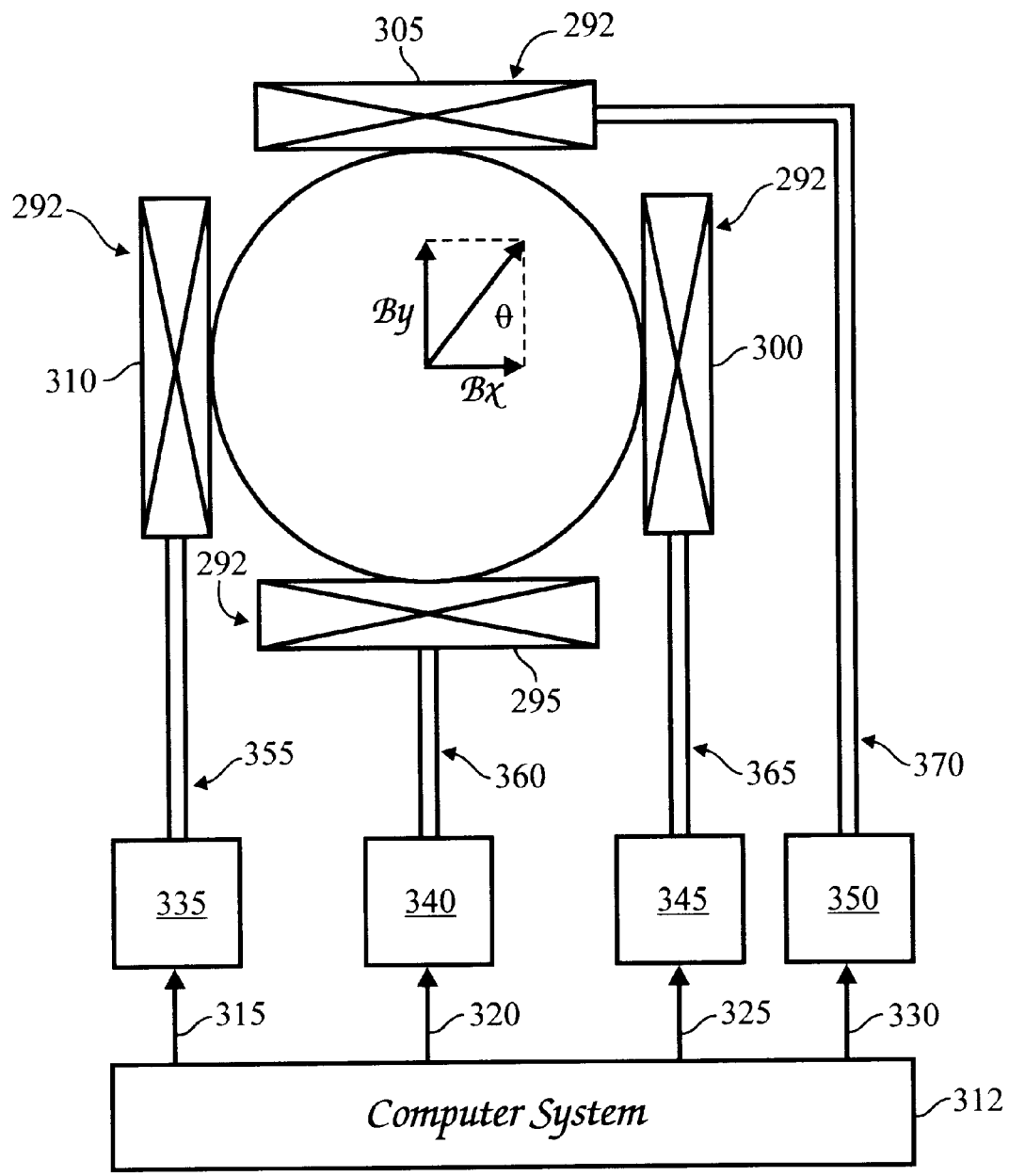
FIG. 6a is schematic diagram of a magnetic field generator system for generating a multi-directional magnetic field in a process chamber.

FIGS. 6a and 6b schematically illustrate a multi-directional magnetic field system for generating a highly directional magnetic field in the plasma zone 65 that enhances the distribution uniformity of the plasma ions. The chamber 55 comprises a metal ceiling that serves as the primary bias electrode above a dielectric member 155 having the power electrode 165 embedded therein. A magnetic field generator 292 that is adjacent to or inside the chamber 55, such as an assembly of electromagnetic coils 295, 300, 305, 310 or permanent magnets (not shown), generates a magnetic field in the plasma zone that is the vector sum of the magnetic fields produced by each magnetic field generator. The magnetic field depends on the position of the magnetic field generator 292 relative to the plasma zone 65 and mode of operation. Preferably, the magnetic field generator 292 generates a multi-directional magnetic field having an angular orientation and magnitude that varies over time. In one embodiment, the multi-directional magnetic field generator 292 comprises a plurality of electromagnets 295, 300, 305, 310 positioned adjacent to a sidewall 70 of the chamber 55. The electromagnets 295, 300, 305, 310 are powered by an electromagnet power source that varies the current applied to the coils of the electromagnets to generate the multi-directional magnetic field in the plasma zone. A suitable coil arrangement comprises a plurality of paired electrically conducting coils, each pair of coils generating a magnetic field substantially planar to the plane of the substrate 30. The power source energizes the plurality of paired coils in a selected sequence for electrically generating a D.C. magnetic field and selectively moving the magnetic field by independently varying the angular orientation magnitude of the magnetic field generated by each coil pair. Instead of being positioned adjacent to the sidewalls 70 of the chamber 55, the electromagnetic field generator 292 can also be disposed above the ceiling of the chamber and/or below the unitary dielectric member 155 having the power electrode 165 therein, as for example disclosed in U.S. Pat. No. 5,255,024 which is incorporated herein by reference. Alternatively, the magnetic field generator 292 can comprise a plurality of movable permanent magnets positioned adjacent to the sidewall 70 of the chamber 55 (not shown). The magnets can be mounted on an armature that is rotated in a circular or elliptical orbit, and/or in a linear manner to generate the multi-directional magnetic field in the plasma zone 65. Suitable permanent magnets comprise ferromagnetic materials, such as nickel ferrite, cobalt ferrite, or barium ferrite, preferably, having a field strength of about 35 to about 100 Gauss.

The electromagnetic field generator 292 generates a magnetic field that is the vector sum of the magnetic fields produced by each coil or magnet, and that depends on their position relative to the chamber 55 and their mode of operation. The electromagnetic coils or magnets can be arranged to provide a magnetic field that has components which are substantially parallel to the surface of the substrate 30 and symmetrical about an axis orthogonal to the substrate surface. In this version, the E X B drift velocity imparted to electrons in the plasma is azimuthal and urges the electrons in the plasma sheath to travel in a circular path in a plane parallel to, and immediately above, the processing surface of the substrate 30. In another embodiment, the coils or magnets are arranged to provide a magnetic field that has major components which are substantially orthogonal to the plane of the substrate 30. In yet another embodiment, the coils or magnets can be arranged to provide a magnetic field that has components which are at an angle to or curved across the space or volume of the plasma zone 65 and above the plane of the substrate 30. The particular orientation of the magnetic field of the magnetic field generator 292 is chosen to enhance the uniformity and rates of processing of the substrate 30.

In a preferred embodiment, the magnetic field generators 295, 300, 305, 310 form mutually perpendicular magnetic vectors $B_y$ and $B_x$, respectively, which are generally parallel to the pedestal/cathode and the substrate, as disclosed in commonly held U.S. Pat. No. 5,215,619, which is incorporated herein by reference. In the exemplary illustration of FIG. 6a, a computer 312 applies control signals via lines 315, 320, 325, 330 to conventional power systems 335, 340, 345, 350 to control the magnitude and direction of the currents supplied over conductors 355, 360, 365, 370, respectively, to the electromagnets 295, 300, 305, 310. The associated current determines the direction and magnitude of the field generated by each coil pair. Alternatively, the computer 312 can be used to control oscillation movement of magnetic field generators 292 comprising a set of permanent magnets of ferromagnetic material positioned in an armature that can be rotated in a circular/elliptical form or oscillated in a linear direction. The perpendicular field vectors $B_y$ and $B_x$ generated by the electromagnetic field generator 292 are defined by the functions $B_x = B \cos \theta$; and $B_y = B \sin \theta$. Given the desired of required values of the field, B, and its angular orientation $\theta$, the computer 312 can independently solve the equations to obtain the associated magnetic field vectors $B_y$ and $B_x$ which provide the desired strength of field and orientation and then control application of the necessary electric currents in the coils or control movement of the permanent magnets, to provide the desired magnetic fields $B_y$ and $B_x$.

Moreover, the angular orientation and magnitude of the DC magnetic field can be independently altered as quickly or as slowly as desired by changing the current in the electromagnetic coils 295, 300, 305, and 310 or by rotational movement of the magnets. The computer 312 control is used to vary the time that the magnetic field is at each angular position, the direction of the angular stepping function, and the field intensity. Thus the magnetic field can be stepped around the substrate 30 using selected orientation and time increments. If desired, the magnitude of the resultant field $B_\theta$ can be changed if the process conditions or chamber configuration require a constant field strength. Preferably, the magnetic field is rotated at a slow rate of 2 to 5 sec./revolution, by sequentially changing the currents to the electromagnetic coils or rotating the magnets. This steps the magnetic field about the substrate 30 at a slow rate and increases etch uniformity 360° around the substrate, rather than in one direction across the substrate. As a result, the chamber 55 can be used over a wide range of pressures with directionality, selectivity, and uniformity that exceed those of even low pressure etching systems.

In etching processes, generally, as the magnetic field strength is increased, the protective sidewall deposits formed in a plasma etching process are thickened (when an oxygen source is present), providing greater taper and less bowing in the profiles of the etched trenches. The ability to change the magnetic field provides control of the etch feature profile with increasing depth in the trench. For example, in very narrow and deep trenches it may be desirable to have a wider trench mouth to facilitate filling of the trench with dielectric material. The taper control provided by adjusting the magnetic field provides funnel-shaped, wide mouth, and narrow bodied trenches.

The computer control system 312 for the process chamber 55 is operated using a computer program that runs on a conventional computer system comprising a central processor unit (CPU) interconnected to a memory system with peripheral control components, such as for example a 68040 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system 312 to load the code in memory, for to perform the tasks identified in the program.

Curved Dome Ceiling

Figure 7B:
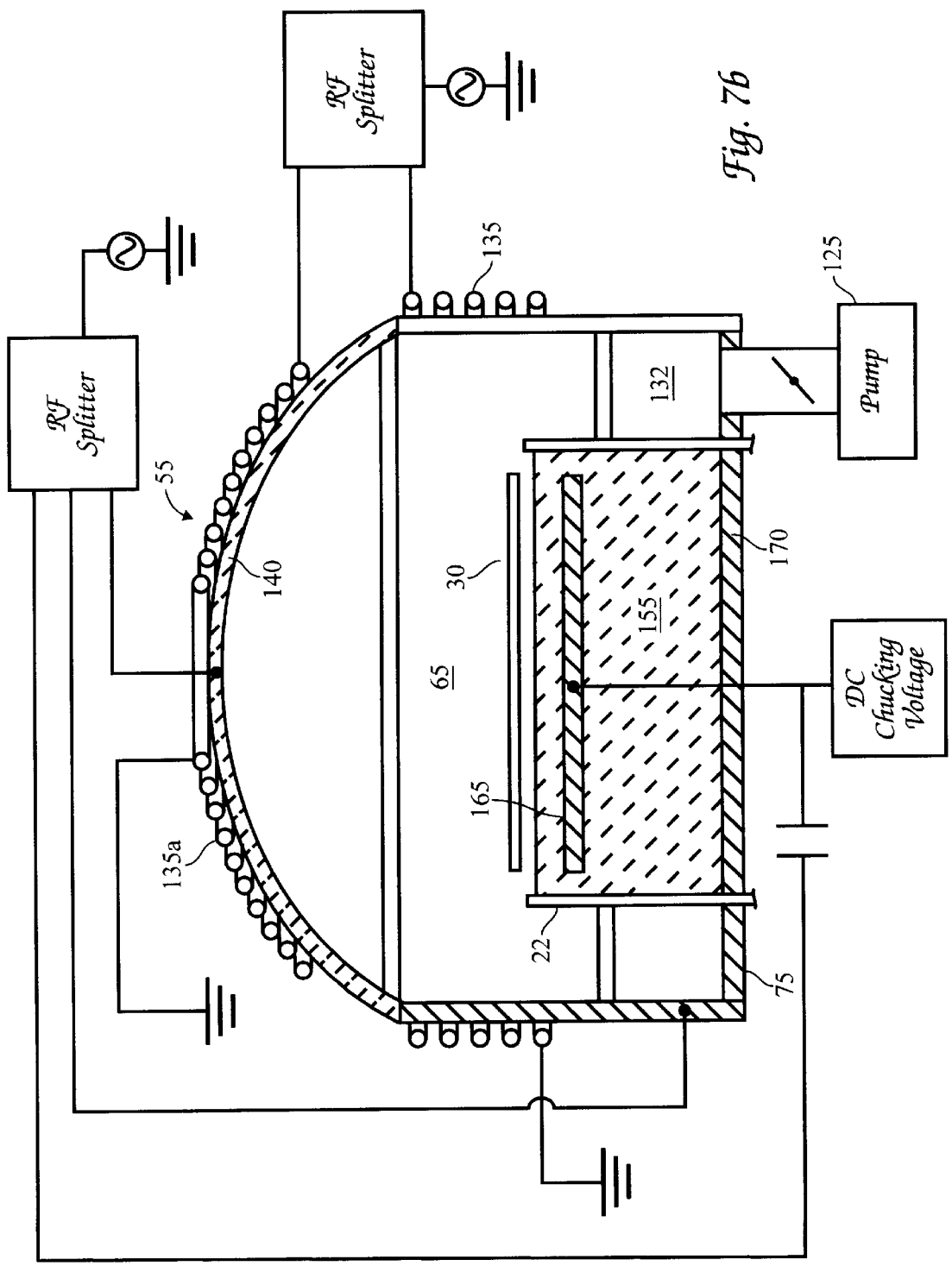

FIGS. 7a and 7b illustrate alternative embodiments of the process chamber 55 which comprise a cylindrical shape with a dome shaped ceiling 140. The dome ceiling 140 comprises dielectric material which is transparent to RF fields or can comprise an integral piece of silicon or tiles of silicon bonded to one another using a adhesive material to provide a curved shape. The ceiling 140 can be of any suitable shape including a planar, dome, conical, truncated conical, cylindrical, or combination of such shapes. Preferably, the inductor antenna 135 is non-conformal to the top surface of the chamber 55, i.e., the vertical pitch of the antennas (which is the vertical height divided by the horizontal width) is greater than the pitch of the top surface of the chamber 55, even for ceilings defining three-dimensional shapes. This arrangement concentrates the induction field of the antenna 135 near each of their central axis of symmetry. Also, because the antenna 135 is positioned above the ceiling 140 of the process chamber 55 instead of around the side of the chamber, the volume of the chamber that is required to provide the required inductive skin depth is lower, and the plasma zone 65 can be confined to a smaller volume of space.

Plasma Ion Density and Energy Distribution

Various experiments were conducted on different chamber configurations described herein, to demonstrate the plasma ion density and energy level functions across the surface of the substrate in the chambers. For example, the ion energy spectra at the surface of a substrate 30 was measured in environments that simulated the process chamber 55 of the present invention as compared with environments simulating a conventional process chamber. The conventional process chamber 20 had a chamber load impedance of 8300 picofarad; and the chamber 70 of the present design had a much lower chamber load impedance of about 450 picofarad (about $\frac{1}{18}^{th}$ the impedance of the conventional chamber). Both chambers had a constant plasma load impedance of about 358 picofarad. Thus, for the present invention, the load impedance due to the plasma is much greater than that due to the chamber itself, and as a result it is possible to design a fixed match network 235 to match the impedance of the RF voltage module 265 to that of the plasma. In both chambers, the plasma ion energy spectra was measured using a small battery powered electrostatic energy analyzer built into the dielectric member 155 and coupled to the external environment by a fiber optic link. The dielectric member 155 was covered with a blank silicon wafer and a small hole drilled thorough the wafer allowed access of the plasma ions to the analyzer. This arrangement allowed measurements of plasma ion energy distributions in situ in the chamber 55 and during actual process conditions.

Figure 8:
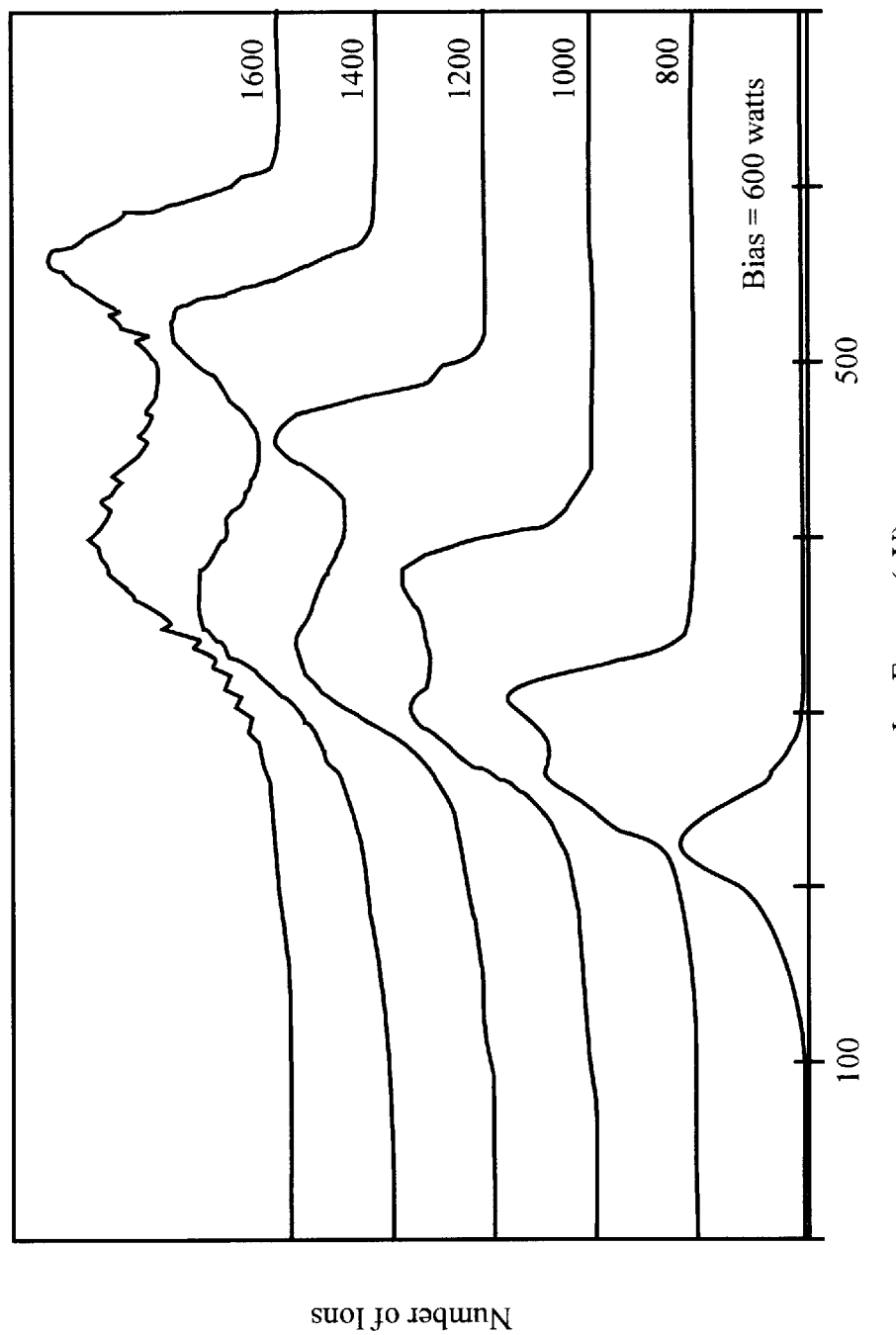
FIG. 8 is a graph showing the bimodal plasma ion energy distributions obtained for different RF bias power levels in a conventional process chamber.
Figure 9:
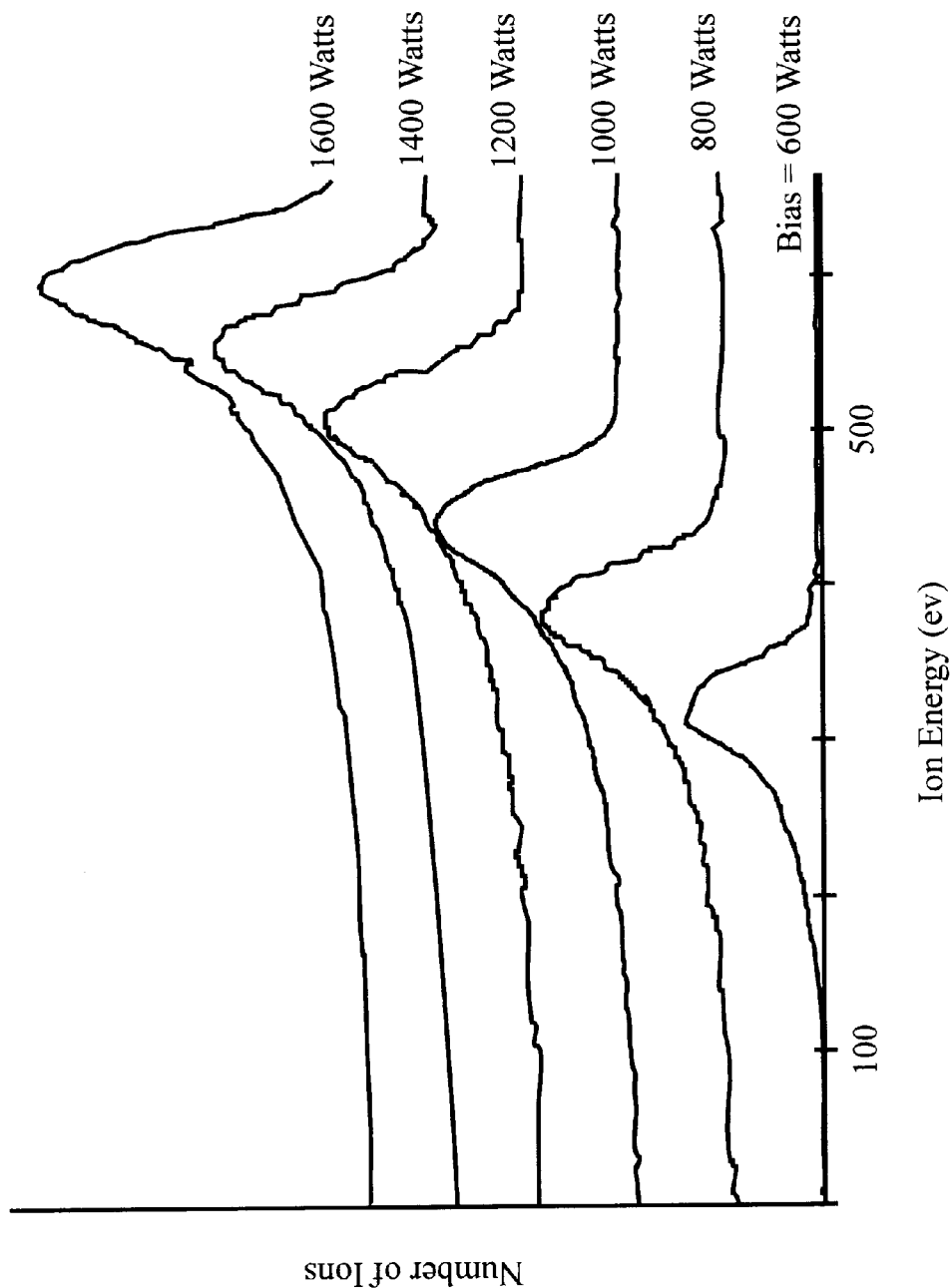
FIG. 9 is a graph showing the unimodal plasma ion energy distributions obtained at different RF bias power levels in a process chamber of the present invention.

FIG. 8 shows the ion energy distribution in a conventional process chamber 20 that has a "hot" cathode electrode below the substrate 30 and insulator shields surrounding the cathode. The chamber 20 has a higher capacitive load which arises from the insulator shield structure and other components in the chamber. The higher capacitive load significantly affects the plasma ion energy distribution, particularly at higher RF bias power levels, to provide a multimodal or multi-peak ion energy distributions. The multiple peaks centered at different energy levels provide a large distribution or spread of ions having substantially different energy levels, and a relatively large number of plasma ions at low energy values. For example, the first curve at an RF bias power of 600 Watts has a peak at 230 eV, which is lower by about 100 eV as compared to the peak of the ion energy distribution curve obtained for the same Rf power level in the present chamber design as shown in FIG. 9. Thus, for the same RF bias power level, the total number of ions at higher energy levels is lower in conventional chamber designs, than in the present chamber 55. At higher RF bias power levels, a bimodal distribution having both a large and small peak is obtained. Such bimodal ion energy distributions do not efficiently etch narrow or high aspect ratio holes in the substrate 30 often resulting in "etch stop" processes (where the etching process stops in the trench without etching through the requisite depth).

In contrast, the process chamber 55 of the present invention with its relatively low capacitive load, and multiple electrodes, provided substantially monomodal ion energy distributions, regardless of the RF bias voltage applied to the power electrode 165 in the chamber. FIG. 9 shows the plasma ion energy distribution as a function of increasing RF bias voltages applied to the power electrode 165, while the primary and secondary bias electrodes 145, 170 are electrically grounded, and a single inductor coil above the chamber 55 was operated at a fixed power level of 2800 Watts. In the figure, the x-axis shows the measured plasma ion energy levels and the y-axis shows the number of plasma ions reaching the sensor as a function of increasing RF bias voltages applied to the power electrode 165. The peak of the plasma ion energies levels that were measured corresponded to the maximum negative voltage of the RF waveform. The peak of the first curve at an RF bias of about 600 Watts comprises a single high intensity peak which indicates a monomodal ion energy distribution with the peak centered at 330 eV. As the RF bias voltage is increased, the mean value of the peak of the monomodal ion energy distributions shifts to the right, with a peak at 400 eV at an RF bias power level of 800 Watts. As the RF bias power levels increase to 1000, 1200, 1400 and 1600 Watts, the ion energy levels shift to the right and peak at about 600 eV. The monomodal ion energy distributions that shift across the x-axis indicates that all the power applied to the plasma is efficiently used to creating highly directional ions that etch high aspect ratio trenches, such as SAC etches or contact etches which are vertically long with narrow openings. These experiments demonstrate that the monomodal ion energy distributions having singular peaks with relatively small spread of ion energy levels, and uniformly shift to higher energy levels with increasing RF voltage applied to the electrodes without changing in shape to a bimodal or spread-out ion energy distribution.

Figure 10:
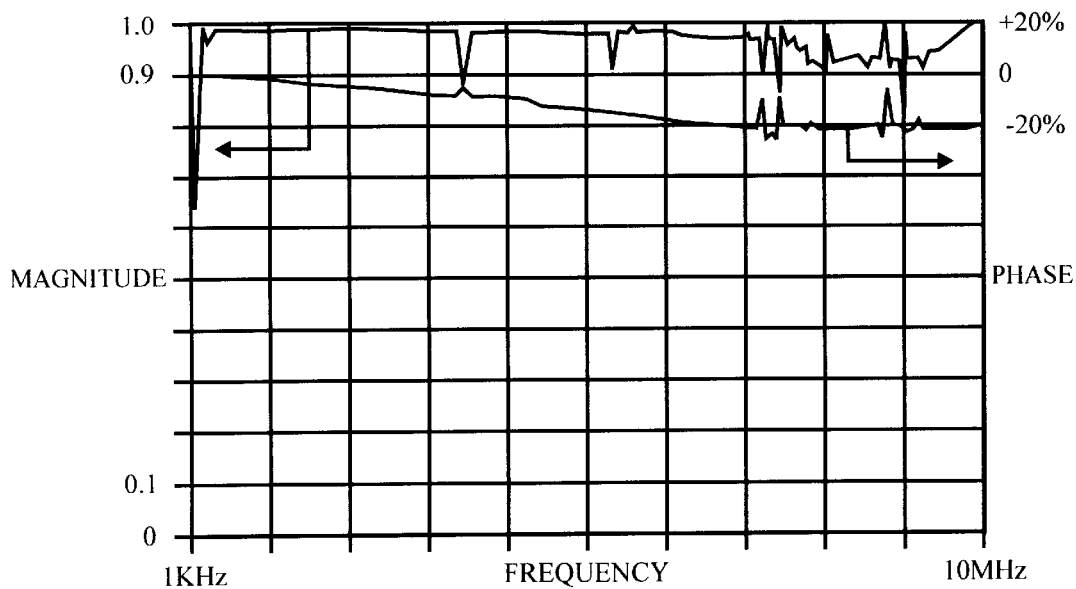
FIG. 10 is a graph illustrating the normalized forward voltage transmission coefficient from a transmitting RF inductor antenna to a receiving RF inductor antenna with a silicon semiconductor slab between the transmitting and receiving antennas.
Figure 11:
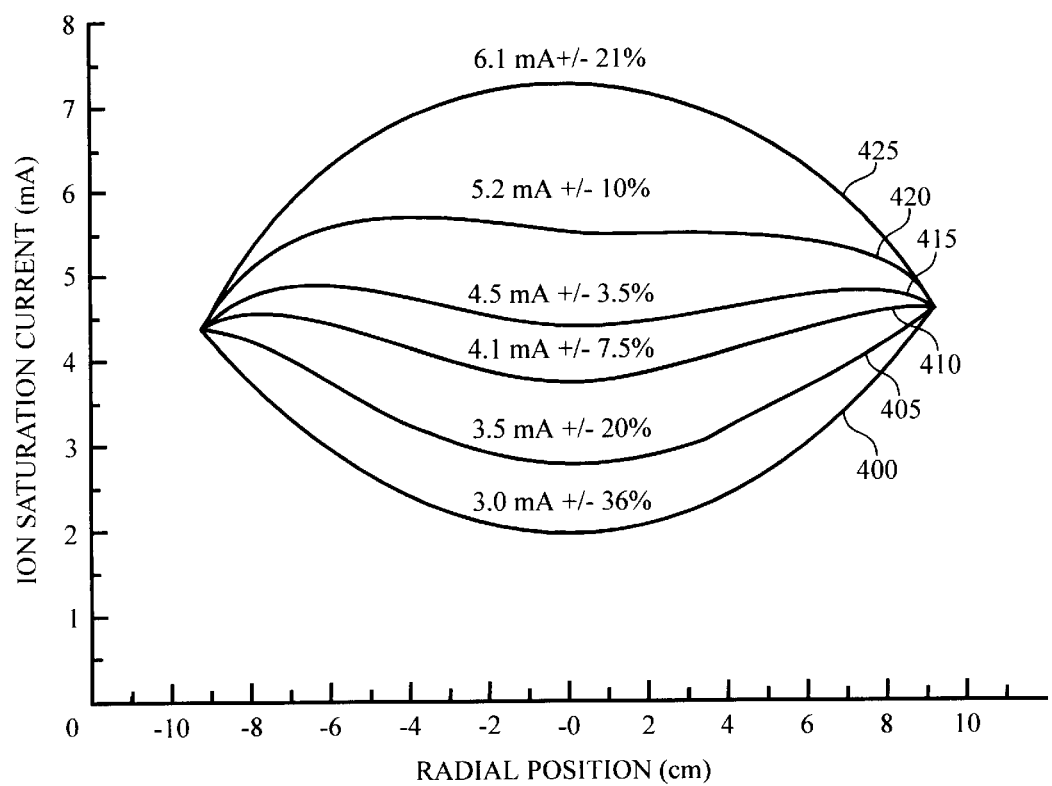
FIG. 11 is a graph showing the ion saturation current as a function of position across the substrate surface and the power level of the current applied to the inductor antenna.

FIG. 10 provides experimental results that demonstrate the low induction power loss or absorption when an RF induction field is transmitted from the inductor antenna 135 through a semiconductor ceiling 140. In this experiment, two inductor antennas were placed on opposite sides of a silicon slab having a diameter of 13.5 inches and thickness of 1 inch. The inductor antenna 135 on one side of the slab was connected to a variable frequency RF source, and the antenna on the other side was connected to a multichannel analyzer. The frequency of the RF source was swept from 1 kHz to 10 MHZ. The resulting output of the multichannel analyzer is shown in FIG. 11. For the curve labeled "magnitude", the vertical axis is the ratio of the magnitude of the received and transmitted signals and extends from a value of unity at the top of the scale and falls in 0.1 increments, while the horizontal axis represents RF frequency from 1 kHz to 10 MHZ. The axis labeled "phase" represents the difference between the phase angles of the received and transmitted signals from a value of 20° at the top of the scale decreasing in 20° increments. FIG. 11 clearly indicates that there is virtually no loss of inductively coupled RF power through the silicon slab up to a frequency of about 2 MHZ and a relatively low loss of inductively coupled RF power at frequencies above 2 MHZ.

The wide range of plasma ion saturation currents and the uniformity of the plasma ion current as a function of radial position across the surface of the substrate 30 is demonstrated by FIG. 11. In this experiment, the process chamber 55 of FIG. 2 was supplied with an argon and oxygen gas in a 3:1 ratio at a flow rate of 600 sccm. The temperature of the silicon roof 140 was maintained at 210° C. The bias power supplied to the process electrodes was held at 0 watts, and the DC bias to the chucking electrode was −100 volts DC. The total source power was maintained at 1800 watts. The first lowest curve 400 was obtained for an outer coil power of 1050 watts and an inner coil power of 750 watts; the second curve 405 for 1200/600 watts power; the third curve 410 for 1275/525 watts power; the fourth curve 415 for 1350/450 watts power; the fifth curve 420 for 1500/300 watts power; and the sixth curve 425 for 1800/0 watts power, for the outer/inner coils, respectively. It is demonstrated that by varying the inner and outer source coil power ratio, that the ion saturation current remains constant over a wide range of source and bias power levels. Also, ion saturation current is linearly dependent on coil power level and is essentially independent of the RF bias power levels applied to the different electrodes. Furthermore, the substrate DC bias voltage and the DC coupled RF negative peak voltage (approximate indicators of the average and peak ion energies at the substrate 30) are linearly dependent upon the RF bias power level. Close correlation between ion current uniformity and patterned oxide etch rate uniformity is also shown for a typical etch process.

Figure 12:
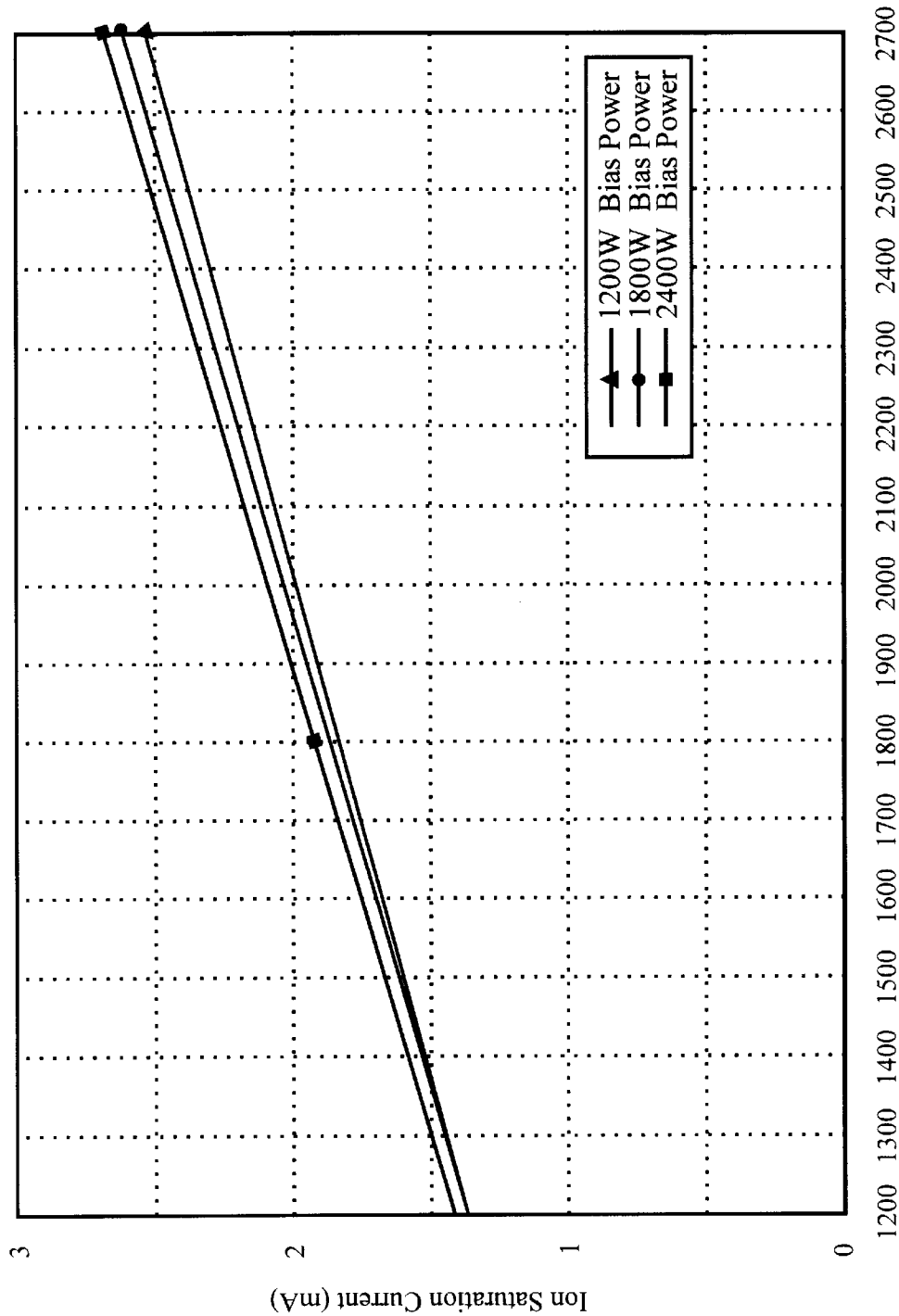
FIG. 12 is a graph showing ion saturation current as a function of inductor antenna power level and RF bias power level.
Figure 13:
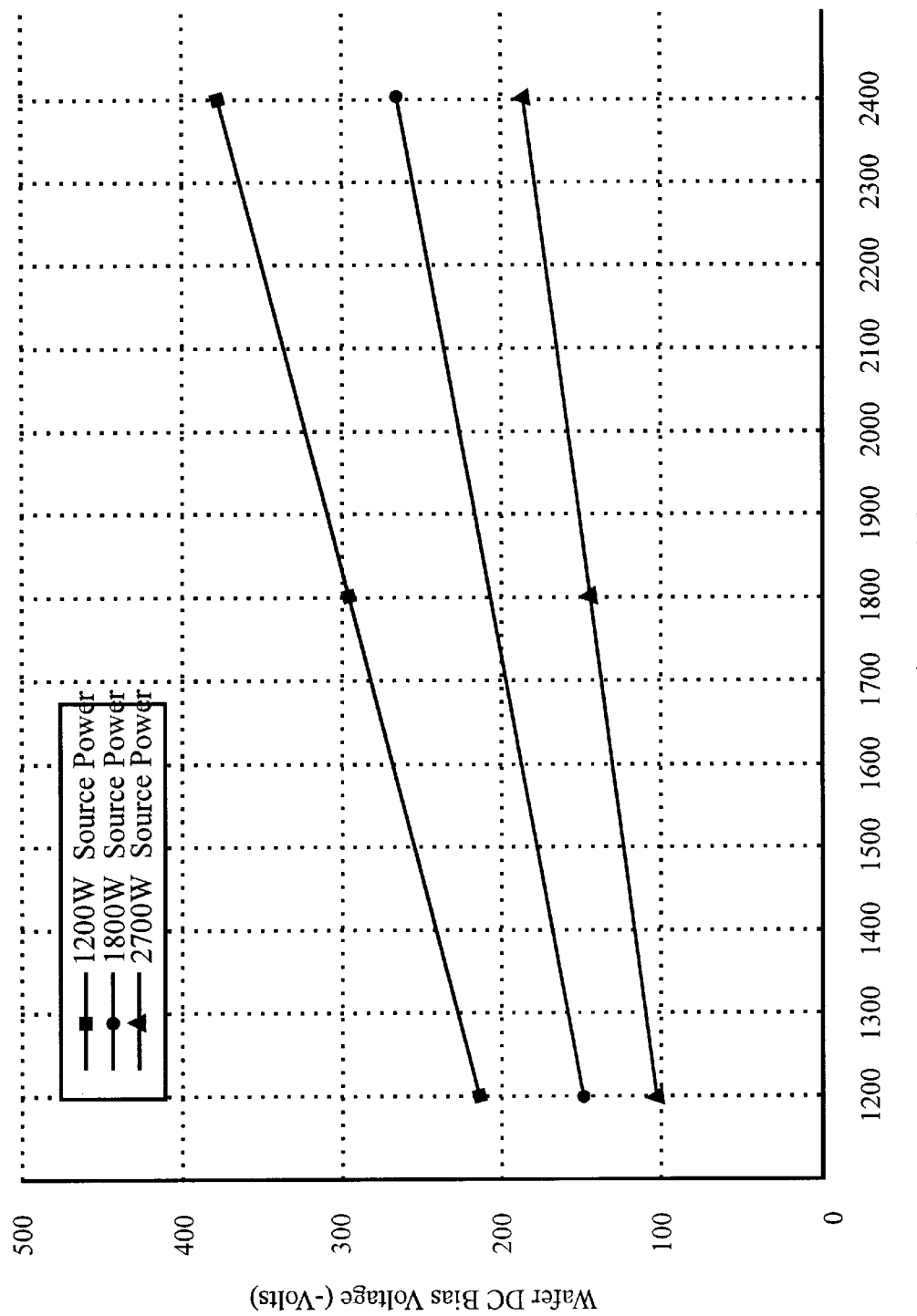
FIG. 13 is a graph showing the effect of inductor antenna power level and RF bias power levels on the D.C. bias potential applied to the substrate.

In the following experiments, the ratio of source power applied to the outer and inner antenna was held to 2:1, the chamber pressure was maintained at 5 mTorr using a process gas comprising Ar and $O_2$ at a ratio 3:1 and at a flow rate of 100 sccm. FIG. 12 shows that ion saturation current varies linearly with increasing source power level applied to the inductor coils, and is virtually independent of the RF power applied to the process electrodes. Even for an increase in RF bias power levels from 1200 watts to double the wattage at 2400 watts, the ion saturation current increases only by a small amount. In contrast, the ion saturation current increases rapidly for rise in source power levels. However, FIG. 13 shows that the RF bias power applied to the process electrodes provides linear control of the wafer DC bias voltage. Thus, independent control of the source power levels to the inductor coils and the power levels applied to the process electrodes provides optimal control of the plasm ion density and energy distribution in the plasma zone.

Figure 14A:
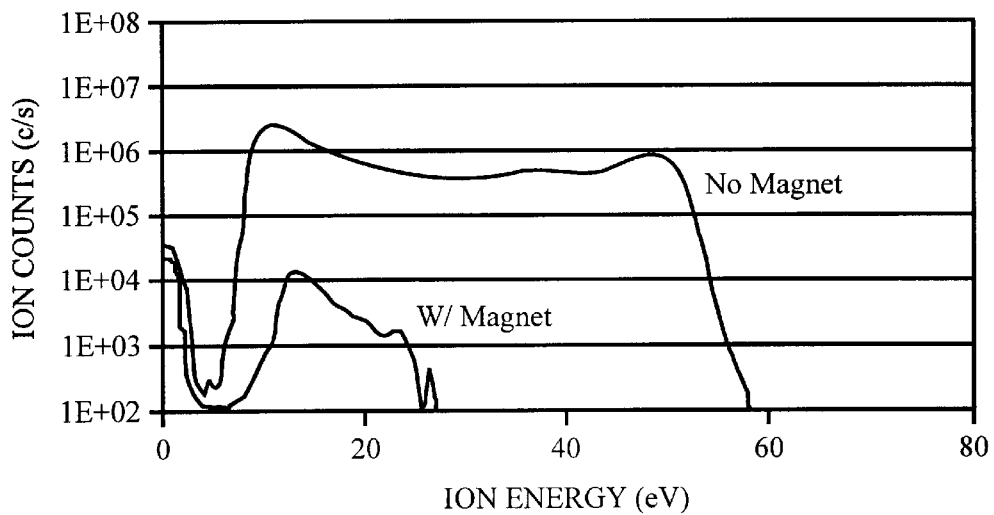
FIG. 14a is a graph showing the effect of magnetic plasma confinement and RF Bias Power on $O_2+$ plasma ion density and ion energy in the plasma zone.
Figure 14B:
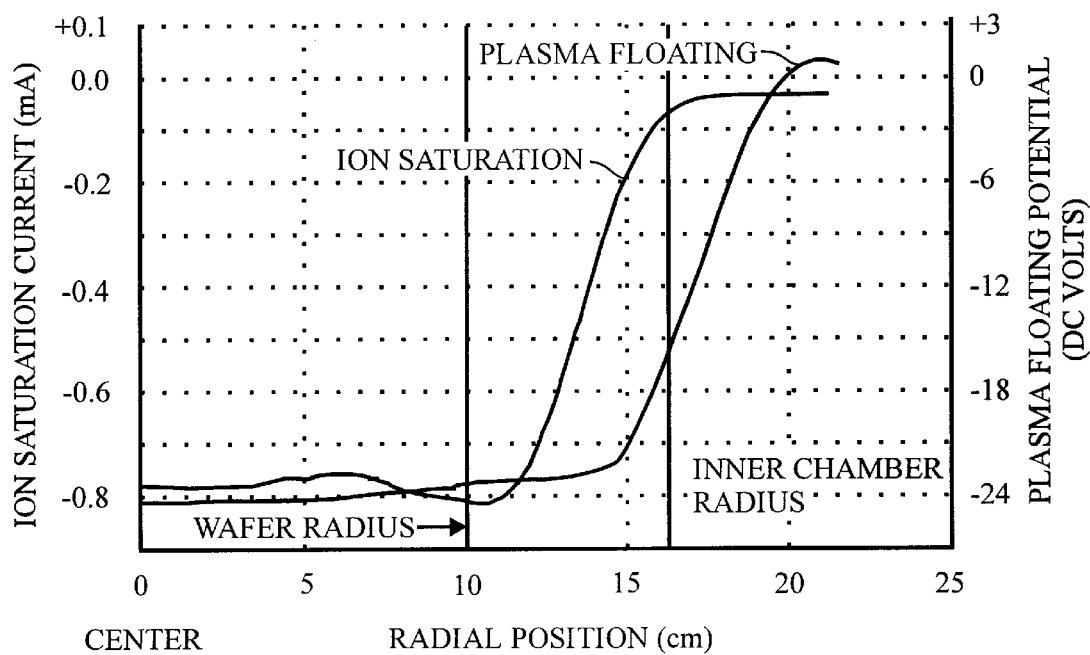
FIG. 14b is a graph showing the effects of magnetic plasma confinement on ion saturation current and plasma floating potential as measured with a Langmuir probe moved radially across the chamber.

FIGS. 14a and 14b demonstrate the magnetic plasma confinement of the plasma in the plasma zone 65 of the chamber 55. FIG. 14a shows the effect of magnetic plasma confinement and bias power on $O_2+$ plasma ion density and plasma ion energy within and outside the plasma zone 65. The presence of the permanent magnets 285 reduce ion density outside the plasma zone 65 by two orders of magnitude and cut off ion energies greater than 25 eV. FIG. 14b shows magnetic plasma confinement as measured with a Langmuir probe moved radially across the surface of the chamber 55. In these experiments, fluorocarbon process gas was introduced into the chamber 55, and the chamber pressure was maintained at 90 mTorr. An RF voltage at a bias potential of −100 volts D.C. at 1600 Watts was applied to the power electrode 165. A current at a power level of 3100 Watts was applied to the outer inductor coil and 1800 Watts to the inner inductor coil. It is seen that the ion saturation current and the plasma floating potential were uniform across the entire radius of the substrate 30. It also is seen that ion current drops beyond the radius of the substrate 60 and drops rapidly beyond the plasma zone 65 due to magnetic confinement, and that the floating potential drops off with increasing radius, although more slowly than the ion current.

Although the present invention has been described in considerable detail with regard to the preferred versions thereof, other versions are possible. For example, the semiconductor ceiling 140 can comprise thin layers of metal of semiconductor material applied on an induction field transparent window. Also, additional process electrodes operating at different bias levels can also be used in the chamber 55 without deviating from the scope of the present invention. Furthermore, upper, lower, center, ceiling, base, floor, and other such terms of spatial orientation of structures, can be changed to equivalent or opposite orientations without effecting the scope of the present invention. Therefore, the appended claims should not be limited to the descriptions of the preferred versions, materials, or spatial arrangements described herein to illustrate the invention.

What is claimed is:

1. A process chamber capable of processing a substrate in a plasma, the process chamber comprising:
   (a) a process gas distributor capable of distributing process gas into a plasma zone of the process chamber;
   (b) a primary electrode;
   (c) a dielectric member having a power electrode therein, the dielectric member having a receiving surface capable of receiving the substrate;
   (d) a secondary electrode below the dielectric member; and
   (e) an electrode voltage supply adapted to maintain the power electrode, primary electrode, and secondary electrode, at one or more electrical potentials so as to capacitively couple the primary electrode and the power electrode to energize the process gas.

2. The process chamber of claim 1 wherein the electrode voltage supply is adapted to maintain the power electrode at an electrical potential different than the electrical potentials of the primary and secondary electrodes.

3. The process chamber of claim 1 wherein the electrode voltage supply is adapted to maintain the power electrode at a first electrical potential, the primary electrode at a second electrical potential, and the secondary electrode at a third electrical potential.

4. The process chamber of claim 1 wherein the electrode voltage supply is adapted to maintain the power electrode and the primary electrode at electrical potentials that differ by at least about 1000 volts.

5. The process chamber of claim 1 absent an insulator shield surrounding the dielectric member.

6. The process chamber of claim 1 wherein the dielectric member comprises a cover layer capable of allowing coupling of an RF voltage applied to the power electrode through the cover layer and to the primary electrode, and a support layer capable of reducing coupling of the RF voltage applied to the power electrode through the support layer to the secondary electrode.

7. The process chamber of claim 6 wherein the cover layer comprises an RF reactance of about 1 to about 500 Ohms, and the support layer comprises an RF reactance of about 100 to about 10000 Ohms.

8. The process chamber of claim 6 wherein the cover layer comprises a dielectric constant of at least about 2 and a thickness of about 1 to about 1000 microns; and the support layer comprise a dielectric constant of at least about 1 and a thickness of about 0.1 to about 15 mm.

9. The process chamber of claim 6 wherein the power electrode comprises a perimeter edge facing an electrically grounded sidewall of the process chamber, and wherein the dielectric member comprises a non-coupling side layer that covers the perimeter edge.

10. The process chamber of claim 1 wherein the ratio of the surface area of the primary electrode to the surface area of the power electrode is at least about 0.9:1.

11. The process chamber of claim 1 wherein the secondary electrode comprises a conductor element having a surface exposed to the plasma and absent an insulator shield.

12. The process chamber of claim 11 wherein the secondary electrode comprises channels adapted to circulate heat transfer fluid therethrough, and wherein the voltage supply is adapted to maintain the secondary electrode at a floating electrical potential.

13. The process chamber of claim 1 wherein the dielectric member comprises a monolith made from one or more of aluminum oxide, aluminum nitride, boron carbide, boron nitride, diamond, silicon oxide, silicon carbide, silicon nitride, titanium oxide, titanium carbide, yttrium oxide, and zirconium oxide.

14. The process chamber of claim 1 further comprising an inductor antenna adjacent to the process chamber.

15. The process chamber of claim 14 wherein the inductor antenna is adjacent to the ceiling of the process chamber and wherein the ceiling is capable of allowing an inductive field to permeate therethrough.

16. The process chamber of claim 15 wherein the primary electrode is formed on the ceiling of the process chamber.

17. The process chamber of claim 15 wherein the inductor antenna comprises inner and outer antennas.

18. A method of using the process chamber of claim 14 to process a substrate, the method comprising the steps of:
   (a) placing a substrate on the receiving surface of the unitary dielectric member;
   (b) passing a current through the inductor antenna to generate an inductive field in the chamber; and
   (c) maintaining the power electrode, primary bias electrode, and secondary bias electrode at different electrical potentials thereby maintaining a high density, highly directional plasma in the chamber.

19. A method according to claim 18 comprising the steps of applying RF and DC voltages to the power electrode embedded in the unitary monolithic dielectric member, and electrically grounding the primary and secondary bias electrodes.

20. A process chamber capable of processing a substrate in a plasma, the process chamber comprising:
   (a) a process gas distributor capable of distributing process gas into a plasma zone in the chamber;
   (b) a primary electrode;
   (c) a dielectric member comprising a power electrode therein, the dielectric member comprising (i) a coupling layer having a receiving surface for receiving a substrate in facing relationship to the primary electrode, the coupling layer comprising an electric field absorption sufficiently low for the power electrode to capacitively couple with the primary electrode to energize process gas in the chamber and to electrostatically hold the substrate, and (ii) a non-coupling layer surrounding the other surfaces of the power electrode, the non-coupling layer comprising an electric field absorption sufficiently high to substantially preclude capacitive coupling of the power electrode to surrounding walls of the chamber;

(d) a secondary electrode below the non-coupling layer; and (e) an electrode voltage supply adapted to provide an RF voltage and a DC voltage to the power electrode in the dielectric member.

21. The process chamber of claim 20 wherein the chamber comprises an impedance load of less than about 3000 picofarads.

22. The process chamber of claim 20 wherein the coupling layer comprises an RF reactance of about 1 to about 500 Ohms, and the non-coupling layer comprises an RF reactance of about 100 to about 10000 Ohms.

23. The process chamber of claim 20 wherein the coupling layer comprises a dielectric constant of at least about 2 and a thickness of from about 1 to about 1000 microns; and the non-coupling layer comprises a dielectric constant of at least about 1 and a thickness of about 0.1 to about 15 mm.

24. The process chamber of claim 20 further comprising an inductor antenna for providing an induction field in the plasma zone.

25. The process chamber of claim 20 wherein the ratio of the surface area of the primary electrode to the surface area of the power electrode is at least about 0.9:1.

26. The process chamber of claim 20 wherein the dielectric member is supported by the secondary electrode, the secondary electrode comprising a conductor element having surfaces adapted to be exposed directly to the plasma, and having channels for circulating heat transfer fluid therethrough.

27. A process chamber capable of processing a substrate in a plasma, the process chamber comprising:

(a) a gas distribution system for distributing process gas into the chamber;

(b) a primary electrode capable of allowing an RF induction field to permeate therethrough;

(c) an inductor antenna to generate the RF induction field; and (d) a dielectric member comprising a power electrode therein, the dielectric member having a coupling layer that has a receiving surface for receiving a substrate and comprises an electric field absorption sufficiently low for RF and DC voltages applied to the power electrode to capacitively couple therethrough to energize process gas in the chamber and to electrostatically hold the substrate, respectively, and an non-coupling layer surrounding the other surfaces of the electrode, the non-coupling layer comprising an electric field absorption sufficiently high to reduce capacitive coupling therethrough;

(e) a secondary electrode below the non-coupling layer; and (f) an electrode voltage supply adapted to maintain the primary electrode and power electrode at different electrical potentials relative to one another thereby energizing the process gas.

28. The process chamber of claim 27 wherein the process chamber is absent any insulator shield surrounding the unitary monolithic dielectric member.

29. The process chamber of claim 27 wherein the coupling layer comprises an RF reactance of about 1 to about 500 Ohms, and the non-coupling layer comprise an RF reactance of about 100 to about 10000 Ohms.

30. The process chamber of claim 27 wherein the cover layer comprises a dielectric constant of at least about 2 and a thickness of about 1 to about 1000 microns; and the non-coupling layer comprises a dielectric constant of at least about 1 and a thickness of about 0.1 to about 15 mm.

31. The process chamber of claim 27 wherein the ratio of the surface area of the primary electrode to that of the power electrode is at least about 0.9:1.

32. The process chamber of claim 27 wherein the dielectric member is supported by the secondary electrode, the secondary electrode comprising a conductor element having surfaces adapted to be exposed directly to the plasma, absent a surrounding insulator shield, and comprising channels for circulating heat transfer fluid therethrough.

33. The process chamber of claim 27 wherein the secondary electrode comprises a secondary electrode below the dielectric member, and wherein the electrode voltage supply (i) maintains the power electrode and the primary electrode at electrical potentials differing by at least about 1000 volts to energize the plasma in the chamber, and (ii) maintains the power electrode and the secondary electrode at electrical potentials differing by at least about 100 volts to reduce stray capacitances in the chamber, thereby providing a plasma having plasma ions that are energized in a direction substantially perpendicular to the surface of the substrate.

34. A method of using the process chamber of claim 27 to process a substrate, the method comprising the steps of:

(a) placing a substrate on the surface of the unitary dielectric member;

(b) passing an RF current through the inductor antenna to generate an RF induction field in the chamber; and (c) maintaining the primary and power electrodes in the chamber at different electrical potentials to form a high density, highly directional plasma in the chamber.

35. A process chamber capable of processing a substrate in a plasma, the process chamber comprising:

(a) a process gas distributor capable of distributing process gas into a plasma zone in the process chamber;

(b) an inductor antenna capable of forming a plasma from the process gas in the plasma zone, and a conducting surface adapted to be exposed to the plasma zone;

(c) a dielectric member below the conducting surface, the dielectric member comprising a receiving surface capable of receiving a substrate thereon, and the dielectric member comprising an electrode; and (d) an electrode voltage supply adapted to maintain the conducting surface and the electrode at different electrical potentials to capacitively couple the conducting surface and the electrode and thereby energize the process gas, wherein the dielectric member comprises a cover layer that has an RF reactance of about 1 to about 500 Ohms, and a surrounding layer having an RF reactance of about 100 to about 10000 Ohms.

36. The process chamber of claim 35 wherein the electrode voltage supply is adapted to maintain the conducting surface and the electrode at electrical potentials that differ by at least about 1000 volts.

37. The process chamber of claim 35 absent an insulator shield surrounding the dielectric member.

38. The process chamber of claim 35 wherein the cover layer comprises a dielectric constant of at least about 2 and a thickness of from about 1 to about 1000 microns; and the surrounding layer comprises a dielectric constant of at least about 1 and a thickness of about 0.1 to about 15 mm.

39. The process chamber of claim 35 wherein the ratio of the surface area of the ceiling to the surface area of the electrode is at least about 0.9:1.

40. The process chamber of claim 39 wherein the dielectric member is supported by a conductor element having surfaces adapted to be exposed directly to the plasma.

41. The process chamber of claim 35 further comprising a plurality of dielectric members.

42. A process chamber capable of processing a substrate in a plasma, the process chamber comprising:
 (a) a gas distribution system for distributing process gas into the chamber;
 (b) a primary electrode;
 (c) a dielectric member comprising a power electrode therein, the dielectric member having a coupling layer that forms a receiving surface adapted to receive a substrate, the coupling layer having an electric field absorption sufficiently low for RF and DC voltages applied to the electrode to capacitive couple therethrough to energize the plasma and to electrostatically hold the substrate, respectively, and a non-coupling layer comprising an electric field absorption sufficiently high to reduce capacitive coupling therethrough;
 (d) an electrode voltage supply adapted to maintain the primary electrode and power electrode at different electrical potentials relative to one another; and
 (e) a multi-directional magnetic field generator adjacent to the chamber and adapted to generate in the plasma zone a multi-directional magnetic field having an angular orientation and magnitude that varies over time,
 wherein the coupling layer comprises an RF reactance of about 1 to about 500 Ohms, and the non-coupling layer comprises an RF reactance of about 100 to about 10000 Ohms.

43. The process chamber of claim 42 wherein the multi-directional magnetic field generator is adapted to generate a multi-directional magnetic field that moves in a circular direction.

44. The process chamber of claim 42 wherein the multi-directional magnetic field generator comprises:
 (1) a plurality of electromagnets positioned adjacent to a sidewall of the chamber; and
 (2) an electromagnet power source that varies the current applied to the electromagnets to generate the multi-directional magnetic field in the plasma zone.

45. The process chamber of claim 44 wherein the electromagnets comprise a plurality of paired electrically conducting coils, each pair of coils generating a magnetic field substantially planar to the plane of the substrate, and wherein the power source energizes the paired coils in a selected sequence for electrically generating a magnetic field and selectively moving the magnetic field by independently varying the angular orientation and magnitude of the magnetic field generated by each coil pair.

46. The process chamber of claim 42 wherein the multi-directional magnetic field generator comprises:
 (1) a plurality of movable permanent magnets positioned adjacent to the chamber; and
 (2) means for moving the permanent magnets to generate the multi-directional magnetic field in the plasma zone.

47. The process chamber of claim 42 wherein the process chamber is absent any insulator shield surrounding the unitary monolithic dielectric member.

48. The process chamber of claim 42 wherein the cover layer comprises a dielectric constant of at least about 2 and a thickness of from about 1 to about 1000 microns; and the non-coupling layer comprises a dielectric constant of at least about 1 and a thickness of about 0.1 to about 15 mm.

49. A process chamber capable of processing a substrate in a plasma, the process chamber comprising:
 (a) a process gas distributor capable of distributing process gas into a plasma zone in the process chamber;
 (b) a primary electrode in the process chamber;
 (c) a dielectric member comprising a power electrode, the dielectric member having a receiving surface capable of receiving a substrate below the primary electrode; and
 (d) an electrode voltage supply adapted to maintain the power electrode and the primary electrode at different electrical potentials relative to one another to energize the process gas,
 wherein the dielectric member comprises a cover layer capable of allowing coupling of an RF voltage applied to the power electrode through the cover layer and to the primary electrode, and a support layer capable of reducing coupling of the RF voltage applied to the power electrode through the support layer to the secondary electrode and wherein the cover layer comprises an RF reactance of about 1 to about 500 Ohms, and the support layer comprises an RF reactance of about 100 to about 10000 Ohms.

50. The process chamber of claim 49 wherein the electrode voltage supply is adapted to maintain the power electrode at a higher electrical potential than an electrical potential of the primary electrode.

51. The process chamber of claim 49 wherein the electrode voltage supply is adapted to maintain the power electrode at a first electrical potential and the primary electrode at a second electrical potential.

52. The process chamber of claim 49 wherein the electrode voltage supply is adapted to maintain the power electrode and the primary electrode at electrical potentials differing by at least about 1000 volts.

53. The process chamber of claim 49 absent an insulator shield surrounding the dielectric member.

54. The process chamber of claim 50 wherein the chamber is absent any insulator shield surrounding the unitary monolithic dielectric member.

55. The process chamber of claim 49 wherein the cover layer comprises a dielectric constant of at least about 2 and a thickness of about 1 to about 1000 microns; and the support layer comprise a dielectric constant of at least about 1 and a thickness of about 0.1 to about 15 mm.

56. The process chamber of claim 49 wherein the power electrode comprises a perimeter edge facing an electrically grounded sidewall of the process chamber, and wherein the dielectric member comprises a non-coupling side layer that covers the perimeter edge of the power electrode.

57. The process chamber of claim 49 wherein the ratio of the surface area of the primary electrode to the surface area of the power electrode is at least about 0.9:1.

58. The process chamber of claim 49 absent an insulator shield surrounding the dielectric member.

59. The process chamber of claim 49 further comprising an inductor antenna adjacent to a dome shaped dielectric ceiling of the process chamber.

60. The process chamber of claim 59 wherein the dielectric ceiling comprises one or more of aluminum oxide, aluminum nitride, boron carbide, boron nitride, diamond, silicon oxide, silicon carbide, silicon nitride, titanium oxide, titanium carbide, yttrium oxide, and zirconium oxide.

61. A process chamber capable of processing a substrate in a plasma, the process chamber comprising:
   (a) a gas distribution system capable of distributing process gas into the chamber;
   (b) a primary electrode;
   (c) an inductor antenna capable of generating the RF induction field;
   (d) a dielectric member having a power electrode therein, and a receiving surface for receiving the substrate, the power electrode adapted to capacitively couple with the primary electrode to energize the process gas, and
   (e) a secondary electrode below the dielectric member.

62. The process chamber of claim 61 further comprising one or more voltage supplies for maintaining a potential across the power electrode and the primary electrode to capacitively couple the electrodes, and for providing a current to the inductor coil to generate the RF induction field in the chamber, whereby a high density, highly directional plasma is formed in the chamber.

63. The process chamber of claim 62 wherein the voltage supply provides to the power electrode an RF voltage adapted to energize the plasma in the chamber, and a DC chucking voltage adapted to electrostatically holds the substrate to the dielectric member.

64. The process chamber of claim 61 wherein the process chamber is absent any insulator shield surrounding the dielectric member.

65. The process chamber of claim 61 wherein the dielectric member comprises a unitary monolith having (i) a coupling cover layer having an RF reactance of about 1 to about 500 Ohms covering the power electrode, to allow coupling of the power electrode to the plasma; and (ii) a non-coupling layer surrounding the other surfaces of the electrode, the non-coupling layer having an RF reactance of about 100 to about 10000 Ohms.

66. The process chamber of claim 61 wherein the ratio of the surface area of the primary electrode to that of the power electrode is at least about 0.9:1.

67. The process chamber of claim 61 wherein the semiconductor wall comprises silicon.

68. The process chamber of claim 61 wherein the dielectric member is supported by a conductor element having surfaces adapted to be exposed directly to the plasma, that is absent a surrounding insulator shield, and which comprises channels for circulating heat transfer fluid therethrough.

69. The process chamber of claim 61 wherein the electrode voltage supply (i) maintains the power electrode and the primary electrode at electrical potential differing by at least about 1000 volts; and (ii) maintains the power electrode and the secondary electrode at electrical potentials differing by at least about 100 volts.

70. A method of using the process chamber of claim 61 process a substrate, the method comprising the steps of:
   (a) placing the substrate on the receiving surface of the dielectric member;
   (b) passing an RF current through the inductor antenna to generate an RF induction field in the chamber; and
   (c) maintaining the primary bias electrode and power electrode in the chamber at different electrical potentials, and applying a current to the inductor antenna, whereby a high density, highly directional plasma is formed in the chamber.

71. A process chamber for processing a substrate in a plasma, the process chamber comprising:
   (a) a process gas distributor capable of distributing process gas into the chamber;
   (b) a primary electrode forming a wall of the chamber, the primary electrode having a conducting surface adapted to be exposed to the plasma;
   (c) a dielectric member comprising a power electrode therein, the dielectric member having a receiving surface layer to receive the substrate, the receiving surface layer covering the power electrode and having an electric field absorption sufficiently low for RF and DC voltages applied to the power electrode to capacitively couple with the primary electrode to energize the process gas and to electrostatically hold the substrate;
   (d) a secondary electrode below the dielectric member; and
   (e) an electrode voltage supply adapted to maintain the primary electrode and power electrode at different electrical potentials relative to one another.

72. The process chamber of claim 71 wherein the electrode voltage supply is adapted to maintain the power electrode at a different electrical potential than the secondary electrode.

73. A process chamber capable of processing a substrate, the process chamber comprising:
   (a) gas distributor capable of distributing process gas into the process chamber;
   (b) a primary electrode;
   (c) a dielectric member having a power electrode therein, the dielectric member having a receiving surface capable of receiving the substrate, wherein the dielectric layer comprises a cover layer having an RF reactance of about 1 to about 500 Ohms and a support layer having an RF reactance of about 100 to about 10000 Ohms.

74. The process chamber of claim 73 wherein the cover layer is capable of allowing coupling of an RF voltage applied to the power electrode through the cover layer and to the primary electrode, and the support layer is capable of reducing coupling of the RF voltage applied to the power electrode through the support layer to the secondary electrode.

75. The process chamber of claim 73 further comprising a secondary electrode below the dielectric member.

76. The process chamber of claim 73 further comprising an electrode voltage supply adapted to maintain the power electrode and primary electrode at one or more electrical potentials so as to capacitively couple the primary electrode and the power electrode to energize the process gas to form a plasma.

77. A process chamber capable of processing a substrate, the process chamber comprising:
   (a) gas distributor capable of distributing process gas into the process chamber;
   (b) a primary electrode;
   (c) a dielectric member having a surface adapted to receive the substrate, the dielectric member having a power electrode therein, the power electrode adapted to capacitively couple with the primary electrode to energize the process gas and adapted to electrostatically hold the substrate; and
   (d) a secondary electrode below the dielectric member.

78. The process chamber of claim 77 wherein the dielectric member a cover layer capable of allowing coupling of an RF voltage applied to the power electrode through the cover layer and to the primary electrode, and a support layer capable of reducing coupling of the RF voltage applied to the power electrode through the support layer to the secondary electrode.

79. The process chamber of claim 77 wherein the dielectric member a cover layer having an RF reactance of about 1 to about 500 Ohms and a support layer having an RF reactance of about 100 to about 10000 Ohms.

80. The process chamber of claim 77 wherein the power electrode is embedded in the dielectric member.

81. The process chamber of claim 1 wherein the power electrode is embedded in the dielectric member.

82. The process chamber of claim 20 wherein the power electrode is embedded in the dielectric member.

83. The process chamber of claim 27 wherein the power electrode is embedded in the dielectric member.

84. The process chamber of claim 61 wherein the power electrode is embedded in th e dielectric member.

85. The process chamber of claim 71 wherein the power electrode is embedded in the dielectric member.

86. The process chamber of claim 61 wherein the primary electrode is capable of allowing an RF induction field to permeate therethrough.

* * * * *